(12) United States Patent
Oyamada et al.

(10) Patent No.: US 7,337,029 B2
(45) Date of Patent: Feb. 26, 2008

(54) DESIGN DATA MANAGEMENT SYSTEM AND TRACE SYSTEM

(75) Inventors: Osamu Oyamada, Kawasaki (JP); Takashi Matsuura, Kawasaki (JP); Yoshitaka Miki, Osaka (KP); Hideko Nagamatsu, Kawasaki (JP); Kazunori Tomita, Kawasaki (JP); Hiroyuki Kishimoto, Kawasaki (JP); Mitsuhiro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/505,596

(22) Filed: Aug. 17, 2006

(65) Prior Publication Data
US 2006/0287750 A1 Dec. 21, 2006

Related U.S. Application Data

(63) Continuation-in-part of application No. 11/289,018, filed on Nov. 29, 2005.

(30) Foreign Application Priority Data

Jun. 17, 2005 (JP) .............................. 2005-178470
Jun. 16, 2006 (JP) .............................. 2006-168185

(51) Int. Cl.
*G06F 19/00* (2006.01)
*G06F 17/30* (2006.01)
*G06Q 10/00* (2006.01)

(52) U.S. Cl. .................... 700/97; 700/95; 700/105; 700/182; 707/203; 705/1

(58) Field of Classification Search ............ 700/95–98, 700/105–107, 180, 182; 715/511, 811, 814, 715/961, 964; 707/203; 705/1, 28
See application file for complete search history.

(56) References Cited

U.S. PATENT DOCUMENTS

| 5,311,438 | A | 5/1994 | Sellers et al. |
|---|---|---|---|
| 6,295,513 | B1 | 9/2001 | Thackston |
| 2003/0177024 | A1 | 9/2003 | Tsuchida et al. |

FOREIGN PATENT DOCUMENTS

| JP | 7-271642 | 10/1995 |
|---|---|---|
| JP | 7-272122 | 10/1995 |
| JP | 2004-178170 | 6/2004 |

*Primary Examiner*—Leo Picard
*Assistant Examiner*—Sean Shechtman
(74) *Attorney, Agent, or Firm*—Greer, Burns & Crain, Ltd

(57) ABSTRACT

A design data management program directs a computer to perform a procedure of converting design data generated at a designing side to a data format applicable to a production side and transmitting the data to the production side, and a procedure of converting the data to data described in a predetermined language and storing the data in the storage device when a notification of a change of the design data is received from the production side.

10 Claims, 24 Drawing Sheets

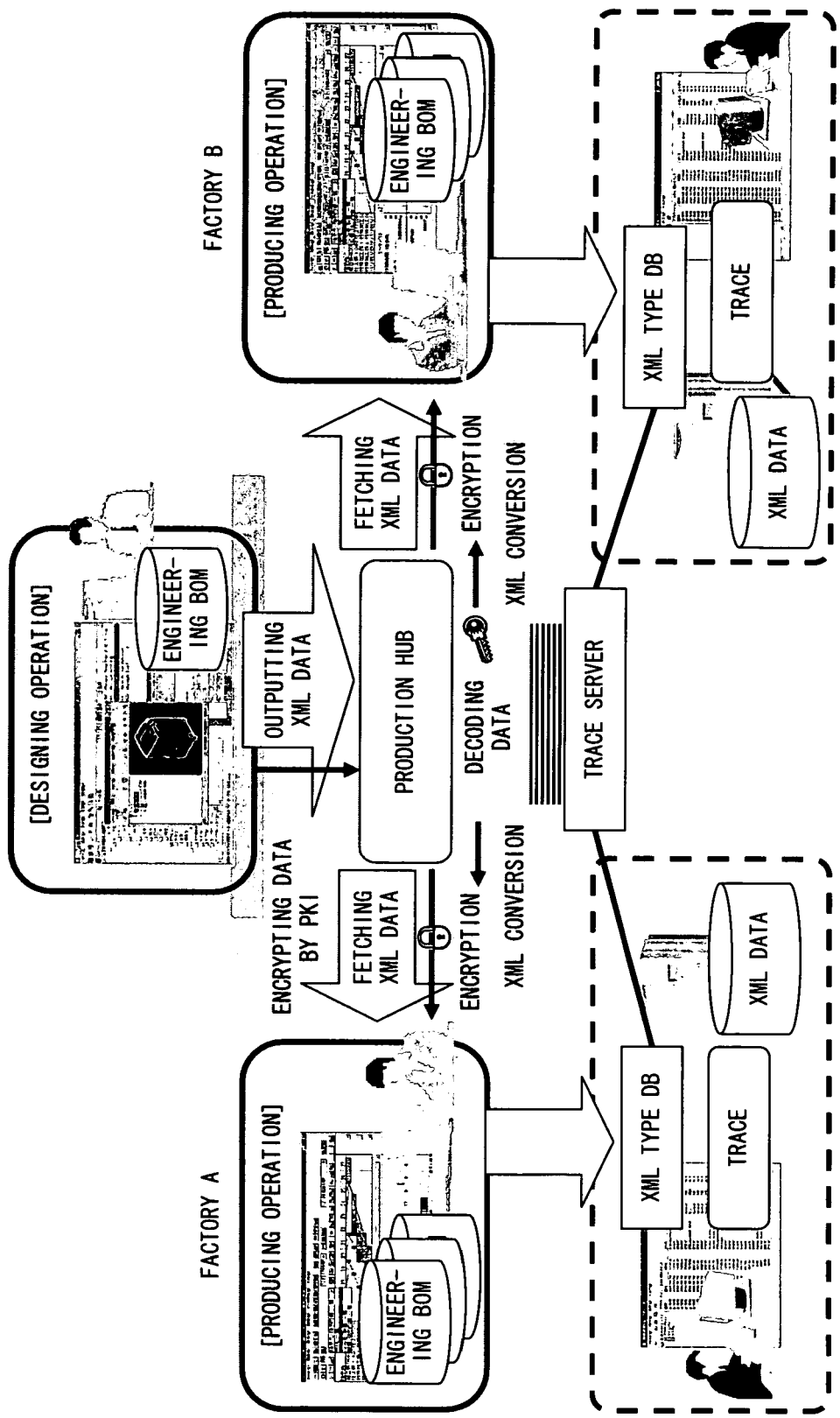
F I G. 2

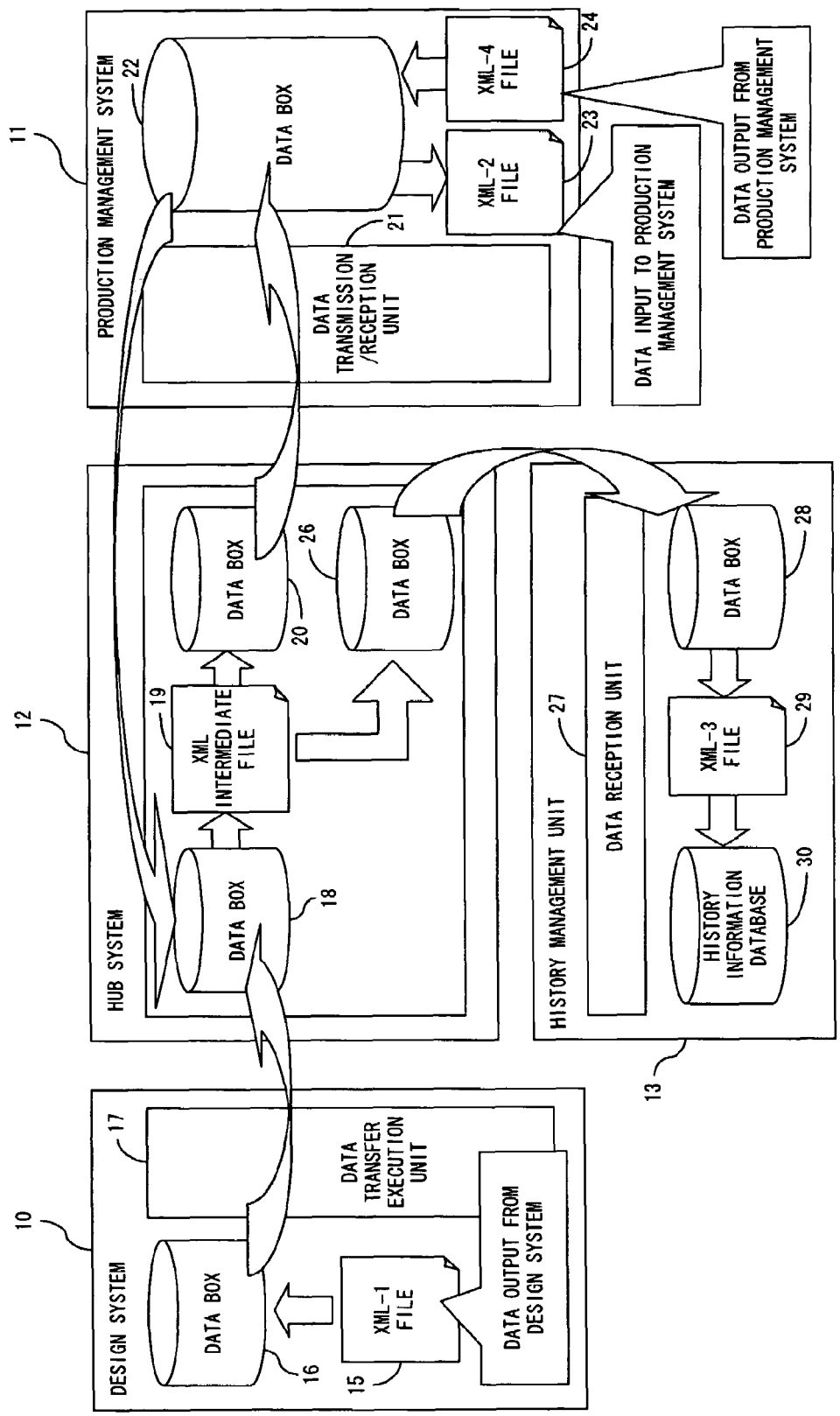
F I G. 3

| DESIGN CHANGE REQUEST DATE | UPPER PART CODE | Seq. No. | NUMERATOR OF QUANTITY | DENOMINATOR OF QUANTITY | UNIT OF QUANTITY | STARTING YEAR, MONTH, AND DAY | ENDING YEAR, MONTH, AND DAY | REASON FOR DESIGN CHANGE |
|---|---|---|---|---|---|---|---|---|
| 2005/3/5 | PX001022 | 4 | 6 | 1 | ONE PIECE | 2005/4/15 | 2005/6/20 | DESIGN FAILURE |
| 2005/3/5 | SD048961 | 3 | 3 | 1 | ONE PIECE | 2005/4/15 | 2005/6/20 | DESIGN FAILURE |
| 2005/3/5 | RD898900 | 2 | 4 | 1 | ONE PIECE | 2005/4/15 | 2005/6/20 | DESIGN FAILURE |
| 2005/4/5 | PX001022 | 4 | 6 | 1 | ONE PIECE | 2005/5/8 | 2005/6/20 | DELETED PARTS |
| 2005/4/5 | SD048962 | 3 | 3 | 1 | ONE PIECE | 2005/5/8 | 2005/6/20 | DELETED PARTS |
| 2005/4/5 | RD898901 | 2 | 4 | 1 | ONE PIECE | 2005/5/8 | 2005/6/20 | DELETED PARTS |
| 2005/4/28 | PX001022 | 4 | 6 | 1 | ONE PIECE | 2005/5/20 | 2005/6/20 | DELETED PARTS |
| 2005/4/28 | SD048963 | 3 | 3 | 1 | ONE PIECE | 2005/5/20 | 2005/6/20 | DELETED PARTS |
| 2005/4/28 | RD898900 | 2 | 4 | 1 | ONE PIECE | 2005/5/20 | 2005/6/20 | DELETED PARTS |
| 2005/6/1 | PX001022 | 4 | 6 | 1 | ONE PIECE | 2005/6/10 | 2005/6/20 | COST REDUCTION |
| 2005/6/1 | SD048961 | 3 | 3 | 1 | ONE PIECE | 2005/6/10 | 2005/6/20 | COST REDUCTION |
| 2005/6/1 | RD898902 | 2 | 4 | 1 | ONE PIECE | 2005/6/10 | 2005/6/20 | COST REDUCTION |
| 2005/6/3 | PX001022 | 4 | 6 | 1 | ONE PIECE | 2005/6/10 | 2005/6/20 | DEFECTIVE DESIGN |

F I G. 6

CHANGED PORTION IN FACTORY B ⇩

| DESIGN CHANGE REQUEST DATE | UPPER PART CODE | Seq. No. | NUMERATOR OF QUANTITY | DENOMINATOR OF QUANTITY | UNIT OF QUANTITY | STARTING YEAR, MONTH, AND DAY | ENDING YEAR, MONTH, AND DAY | REASON FOR DESIGN CHANGE |
|---|---|---|---|---|---|---|---|---|
| 2005/3/5 | PX001022 | 4 | 6 | 1 | ONE PIECE | 2005/4/15 | 2005/6/20 | DESIGN FAILURE |
| 2005/3/5 | SD048961 | 3 | 3 | 1 | ONE PIECE | 2005/4/15 | 2005/6/20 | DESIGN FAILURE |
| 2005/3/5 | RD898900 | 2 | 4 | 1 | ONE PIECE | 2005/4/15 | 2005/6/20 | DESIGN FAILURE |
| 2005/4/5 | PX001022 | 4 | 6 | 1 | ONE PIECE | 2005/5/8 | 2005/6/20 | DELETED PARTS |
| 2005/4/5 | SD048962 | 3 | 3 | 1 | ONE PIECE | 2005/5/8 | 2005/6/20 | DELETED PARTS |
| 2005/4/5 | RD898901 | 2 | 4 | 1 | ONE PIECE | 2005/5/8 | 2005/6/20 | DELETED PARTS |
| 2005/4/6 | SD48861 | 2 | 4 | 1 | ONE PIECE | 2005/5/8 | 2005/6/20 | CHANGE IN FACTORY |
| 2005/4/28 | PX001022 | 4 | 6 | 1 | ONE PIECE | 2005/5/20 | 2005/6/20 | DELETED PARTS |
| 2005/4/28 | SD048963 | 3 | 3 | 1 | ONE PIECE | 2005/5/20 | 2005/6/20 | DELETED PARTS |
| 2005/4/28 | RD898900 | 2 | 4 | 1 | ONE PIECE | 2005/5/20 | 2005/6/20 | DELETED PARTS |
| 2005/6/1 | PX001022 | 4 | 6 | 1 | ONE PIECE | 2005/6/10 | 2005/6/20 | COST REDUCTION |
| 2005/6/1 | SD048961 | 3 | 3 | 1 | ONE PIECE | 2005/6/10 | 2005/6/20 | COST REDUCTION |
| 2005/6/1 | RD898902 | 2 | 4 | 1 | ONE PIECE | 2005/6/10 | 2005/6/20 | COST REDUCTION |
| 2005/6/3 | PX001022 | 4 | 6 | 1 | ONE PIECE | 2005/6/10 | 2005/6/20 | DEFECTIVE DESIGN |

FIG. 7

|  | DESIGN FAILURE | DELETED PARTS | COST REDUCTION | DEFECTIVE DESIGN |
|---|---|---|---|---|
| GRAPHIC BOARD | 20 | 5 | 0 | 4 |
| HARD DISK | 15 | 25 | 40 | 0 |
| POWER SUPPLY UNIT | 10 | 14 | 0 | 0 |
| OTHERS | 9 | 21 | 0 | 1 |
| TOTAL | 54 | 65 | 40 | 5 |

F I G. 8

|  | DESIGN FAILURE | DELETED PARTS | COST REDUCTION | DEFECTIVE DESIGN |
|---|---|---|---|---|
| APRIL | 10 | 35 | 10 | 1 |
| MAY | 8 | 21 | 0 | 1 |
| JUNE | 10 | 5 | 0 | 1 |
| JULY | 0 | 0 | 0 | 0 |
| AUGUST | 0 | 2 | 20 | 0 |
| SEPTEMBER | 26 | 2 | 10 | 2 |
| TOTAL | 54 | 65 | 40 | 5 |

FIG. 9

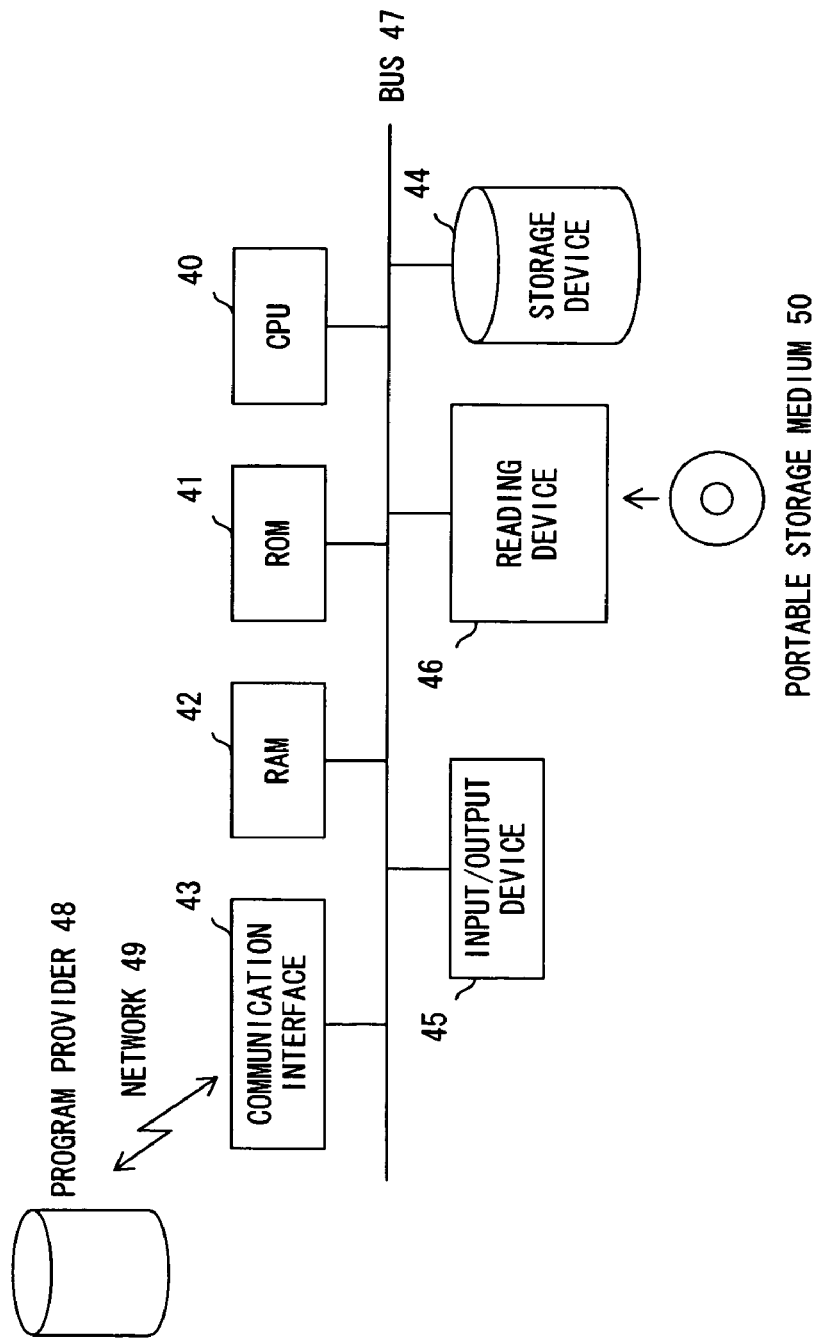
F I G. 15

DESIGN DATA MANAGEMENT SYSTEM AND TRACE SYSTEM

CROSS REFERENCE TO RELATED APPLICATION

This is a continuation-in-part of application Ser. No. 11/289,018, filed on Nov. 29, 2005, which is now pending.

BACKGROUND OF THE INVENTION

1. Field of the Invention

The present invention relates to design data management system, and more specifically to a design data management program for management of not only the design data generated at a designing side, but also the design change data generated at a producing side, for example, a factory, for the design data as data described in a predetermined language, for example, the XML (extensible markup language), and a design data trace program for reading data managed as described above in response to an external request, and displaying as a design data change history the result of retrieval under a given retrieval condition.

2. Description of the Related Art

Recently, using a system such as PDM (product data management), PLM (product lifecycle management), etc. as design data management system, a system of centrally managing various types of engineering data from concept design to general production has been widespread.

Conventionally, at the designing side, that is, in the design system, the time of the design data generated when a new design is used or when a design change is made passes when control is passed to the production side in a factory, for example, the production management division. In the production management division, only the data required in the factory is extracted, and other data is not stored. Therefore, when other design data is required in the factory, the data stored at the design system side is referenced, and the contents have to be confirmed with the manual.

Although production is performed in a factory based on the design data transmitted from the designing side, and, for example, a part to be used in the design data is specified at the designing side, the part may not be used in the factory. For example, when a screw specified in a step cannot be used, another screw is used in the factory. Furthermore, when a specified screw can be used in the factory by obtaining it from, for example, companies A, B, and C, the substitute parts information about which parts are used cannot be obtained at, for example, the designing side. Including the substitute parts information, the design change data at the factory side has not been centrally managed.

That is, when a product is produced in a factory based on specific design data, the design data generated at the design division is transmitted to a plurality of factories, and a plurality of units configuring the product are produced in a plurality of factories, the design data can be uniquely changed or amended by each factory depending on the management level and the convenience of each factory. However, it has been difficult at the design system side to manage the design change data for each factory.

For example, when a product configured by a plurality of units designed by the respective design systems is produced, it is difficult to centrally manage the design data generated by the plurality of design systems in an existing database.

Furthermore, although there is a fault in a product, the parts estimated to be a cause of the fault cannot be detected.

In addition, it cannot be determined whether or not there is a problem with the supplier of a part estimated to be the cause of a fault.

The conventional technologies relating to the above-mentioned design data management system are disclosed by the following documents.

Japanese Published Patent Application No. 7-271642 discloses an engineering information storage device capable of easily checking which version of the component was used in the past document generating process by storing as information data which version of data was used for which component when a document is generated by referring to data of components.

Japanese Published Patent Application No. 2004-178170 discloses a design data management system and program capable of easily converting data for obtaining production data from the design data by converting the design data to input data described in a predetermined format, converting the input data to integral data in a format in which the data can be easily converted to the production data, that is, the data described in the XML, and managing the resultant data.

However, there has still been the problem that the design change data used in each factory cannot be centrally managed including, for example, the substitute parts information although the conventional technologies disclosed by the above-mentioned documents are used.

SUMMARY OF THE INVENTION

The present invention has been developed to solve the above-mentioned problems, and aims at centrally managing the design change data including the substitute parts information used in each factory in addition to the design data generated at the designing side, and realizing correct trace of design data and design change data, for example, for each factory. Furthermore, the objective of the present invention is to determine a part estimated to be the cause of a fault of a product when there occurs the fault in the product and to make it possible to determine whether or not there is a problem with the supplier.

The design data management program according to the present invention is used by a computer in a system for producing the product at the production side based on the design data generated at the designing side. The program includes a procedure of converting the design data generated at the designing side to the data format applicable to the production side and transmitting the converted data to the production side, and converting the generated design data to data described in a predetermined language and storing the data in the storage device. In addition, the program also includes a procedure of converting the design change data to data described in the predetermined language, and storing the data in the storage device when receiving a change notification of design data generated at the designing side from the production side.

The design data trace program according to the present invention is used by a computer in a system for producing the product at the production side based on the design data generated at the designing side. The program includes a procedure of reading from a storage device both design data generated at the designing side and design change data applied at the production side to the design data, which are converted to data described in a predetermined language and stored in the storage device. Furthermore, the program also includes a procedure of retrieving the read data based on a given retrieval condition, and displaying the retrieval result as a design data change history on the screen of the display device.

The design data management program according to the present invention further includes a procedure of converting information about the purchase of a part used on the production side into the data described in a predetermined language and storing the data from the purchase side in the storage device in a mode for embodying the present invention. In this mode for embodying the present invention, it is desired to include a first procedure of identifying a part having a high design change frequency on the production side and a second procedure of identifying a supplier of the part. In addition, in this mode for embodying the present invention, it is desired to further include a third procedure of detecting the design change frequency of another part on the production side provided from the supplier having the high design change frequency, a fourth procedure of detecting the design change frequency of another supplier of the other part, and a fifth procedure of comparing the design change frequency of the other part between the supplier and another supplier.

BRIEF DESCRIPTION OF THE DRAWINGS

FIG. 2 shows the entire configuration of the system in the design data management system and trace system according to the present invention;

FIG. 3 is an explanatory view of the flow of new design data and design change data according to an embodiment of the present invention;

FIG. 6 shows the design change history in the factory A;

FIG. 7 shows the design change history in the factory B;

FIG. 8 shows a result of an aggregate (1) of design change reasons;

FIG. 9 shows a result of an aggregate (2) of design change reasons;

FIG. 15 is an explanatory view of loading a program for realizing the present invention into a computer.

DESCRIPTION OF THE PREFERRED EMBODIMENTS

Figure 1:
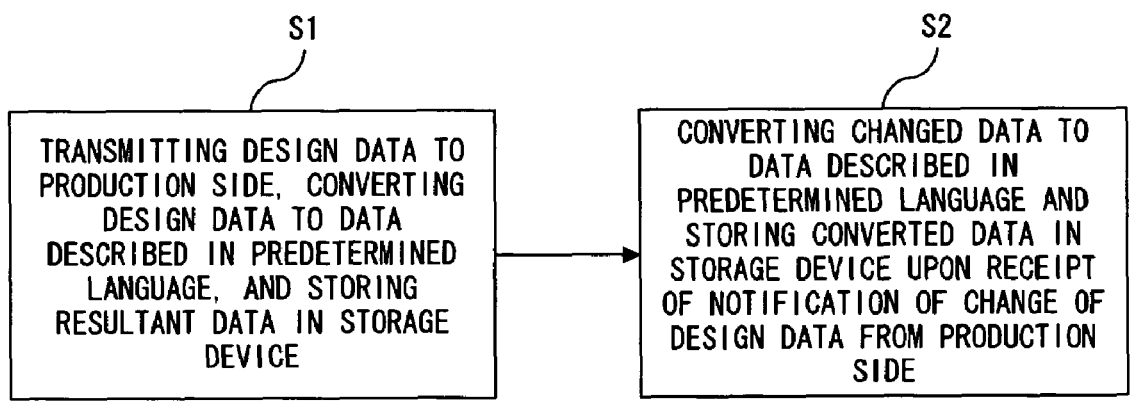
FIG. 1 is a block diagram of the function as the principle of the design data management program according to the present invention.

FIG. 1 is a block diagram of the function as the principle of the design data management program according to the present invention. FIG. 1 is a block diagram of the function as the principle of the design data management program used by a computer in a system in which a product is produced at a production side based on the design data generated at the designing side.

The design data management program according to the present invention performs a procedure of converting the design data generated at the designing side to the data format applicable to the production side and transmitting the converted data to the production side, and converting the generated design data to data described in a predetermined language and storing the data in the storage device in step S1 shown in FIG. 1, and a procedure of converting the design change data to data described in the predetermined language, and storing the data in the storage device when receiving a change notification of design data generated at the designing side from the production side in step S2.

In an embodiment of the present invention, the predetermined language can be an XML, and the data described in the XML can be stored in the above-mentioned storage device in a format in which a code of each part of a product is combined with master data as various types of data relating to the part.

The design data trace program according to the present invention is a program used by a computer in a system as described above to direct a computer to perform the procedure of reading from a storage device both design data generated at the designing side and design change data applied at the production side to the design data, which are converted to data described in a predetermined language and stored in the storage device, and the procedure of displaying the retrieval result based on a given retrieval condition to the read data on the screen of the display device as a design data change history. According to an embodiment of the present invention, the predetermined language can be an XML.

Another mode for embodying the present invention provides a design data management program further comprising the procedure of converting the information about the purchase of a part used on the production side into the data described in a predetermined language and storing the data from the purchase side to the storage device.

Additionally, the mode for embodying the present invention comprises a first procedure of identifying a part having a high design change frequency on the production side, and a second procedure of identifying a supplier of the part.

Furthermore, the mode for embodying the present invention comprises a third procedure of detecting a design change frequency on the production side of another part provided from the supplier having the high design change frequency, a fourth procedure of detecting a design change frequency of another supplier about the other part, and a fifth procedure of comparing the design change frequency of the other part between the supplier and another supplier.

As described above, according to the present invention, in addition to the design data generated at the designing side, the design change data obtained at the production side can be centrally managed, and, for example, the design change data can be traced as a change history for each factory. On the design side, the design change data on the production side is considered and the next design or a design change can be performed.

According to the present invention, the design data and the design change data including the design change data changed in each factory can be centrally managed, and, for example, a design change history of each factory can be traced.

By describing the data to be centrally managed in the XML, the difference in data format between a plurality of design systems can be accepted, and when there are data items in the design data added in the future, it can be accepted by adding the XML data, thereby removing the necessity to restructure the database.

Furthermore, when there is a fault in a product, a part estimated to be the cause of a fault of the product can be determined, and it can be determined whether or not there is a problem with the supplier that provides the part.

FIG. 2 is an entire explanatory view of the design data management system and the design data trace system according to the present invention. In FIG. 2, the engineering BOM (bill of materials) corresponding to the engineering bill of materials generated by the designing operation is output as, for example, XML data to the production HUB for performing management of design data and necessary conversion.

The data is transmitted after, for example, encrypted as XML data to a normally plurality of factories required to produce products, that is, the factories A and B in this example, and used in producing products as the engineering BOM in the producing operation in each factory, and stored in an XML type database directly connected to each factory.

At this time, when it is necessary to change the design data generated by the designing operation in each factory, the design change data is also stored in the XML type database, thereby allowing the trace server for tracing design data to refer to the stored contents of the XML type database directly connected to each factory, and trace the design data change history for each factory.

In the embodiment described later, the design data generated in the designing operation, and the design change data as a result of making a change to the design data at each factory are stored by, for example, the HUB system in one database, and the trace server can output the design change history for each factory by retrieving the stored contents of the database. In this case, the design change data as a result of a change made by each factory to the design data generated in the designing operation is transmitted from each factory to the HUB system, and the design change data is converted by the HUB system to data described in, for example, the XML, and centrally managed. For example, in FIG. 2, the design data output from the designing operation is defined as XML data, but it is not always necessary that the data is described in the XML.

FIG. 3 is an explanatory view of the flow of design data and design change data according to the present embodiment. In FIG. 3, a production HUB system 12 which corresponds to the production HUB shown in FIG. 2 and is used in transferring and converting data is provided between a design system 10 for generating design data and a production management system 11 for fetching the design data at a factory side. The HUB system 12 stores design data and design change data, and a history management unit 13 for managing a design change history is provided.

The HUB system 12 basically performs a process as a server for transferring and converting data when passing to the production management system 11 new design data output from the design system 10 and difference data between the original design data when a design change is made. The HUB system 12 transmits design change data including new design data to the history management unit 13 and accumulates the data therein. The physical memory for accumulation of the data can be a local device or a remote device to the HUB system 12.

In FIG. 3, the data generated by the design system 10 is stored in a data box 16 as an XML-1 file 15, and is transmitted to the HUB system 12 by a data transfer execution unit 17.

In the HUB system 12, the data transmitted from the design system 10 is stored in a data box 18, converted to, for example, an XML intermediate file 19, and is stored in a data box 20. The data stored in the data box 20 is converted to an XML-2 file 23 as data applicable to, for example, the production management system 11, and is transmitted to the production management system 11.

In the production management system 11, the data of the XML-2 file 23 transmitted from the HUB system 12 and received by a data transmission/reception unit 21 is stored in a data box 22, and the file is output to, for example, a factory.

In the HUB system 12, the design data transmitted from the design system 10 as the contents of the XML intermediate file 19, or design change data is converted to an XML-3 file 29 in a format applicable in central management and trace, and is stored in a data box 26, and the data is transmitted to the history management unit 13. In the history management unit 13, the data transmitted from the HUB system 12 is received by a data reception unit 27, and stored in a data box 28. Then, it is stored in a history information database 30 as the XML-3 file 29 in the format applicable for management of the history of design data and design change data.

At the production management system 11, for example, in consideration of data management and procurement of parts in a factory, when the contents of the design data transmitted from the design system 10, that is, the contents of the data of the XML-2 file 23 are changed, the changed data is stored in the data box 22 as a XML-4 file 24, and then it is transmitted by the data transmission/reception unit 21 to the HUB system 12.

In the HUB system 12, the design change data is stored in the data box 18, and is converted to the XML intermediate file 19 as the above-mentioned design data generated by the design system 10 or the design change data, and is stored in the data box 26, converted to the XML-3 file 29, and is transmitted to the history management unit 13. Then, as described above, the history management unit 13 stores the design change data as the XML-3 file 29 in the history information database 30.

Thus, in addition to the design data output from the design system 10 and design change data, the design change data in the production management system 11, that is, in each factory is stored and centrally managed as the XML-3 file 29 in the history information database 30 in the history management unit 13.

Figure 4:
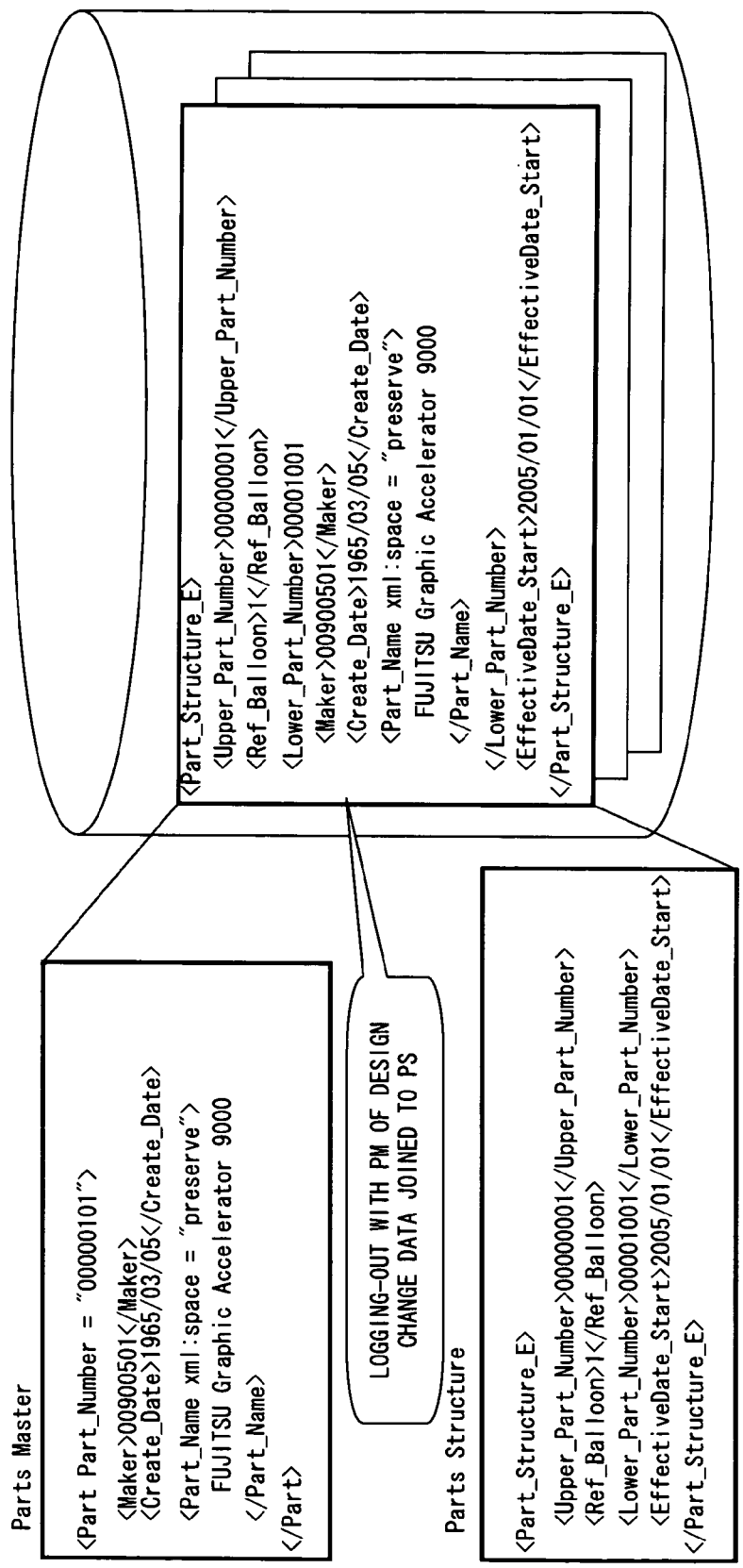
FIG. 4 is an explanatory view of the format of the data stored in the history information database.

FIG. 4 is an explanatory view of the data storage format in the history information database 30 shown in FIG. 3. In the present embodiment, the design data is managed as an XML type database in a format in which master information as various types of information about a part is combined with a part code of the part, for example, data of a part number. Thus, the design data to be stored in a plurality of tables of a normalized database can be managed as one record.

Generally, the parts information for producing a product is hierarchically managed. That is, the structure of the parts information about a product is hierarchically managed by determining, for example, what unit is required to generate a product, what parts are required for each unit, etc. The structure of an upper part and a lower part in the hierarchical structure is managed in a parts structure table, and the master information relating to a part specified by each parts code, for example, a parts number, is managed as a parts master table.

In the present embodiment, as shown in FIG. 4, in storing XML data in the history information database 30 shown in FIG. 3, the data of the parts master table is stored as combined with the data of the parts structure table, and is output as a log as necessary. That is, as shown on the right in FIG. 4, the data is stored in the history information database 30 in the format in which the data of the parts master table is included in the data of the parts structure table. Thus, for example, when data items are added in the future, a change in a data item can be accepted only by adding necessary data to the XML data stored in the format shown in FIG. 4, thereby removing the necessity to change the structure or restructure of a database in response to a change of a data item. For example, when a new design division is added to generate a part for supporting a bottle in addition to the design divisions of a bottle and a cap, it is not necessary to generate a new database for management of the data of the three parts.

Figure 5:
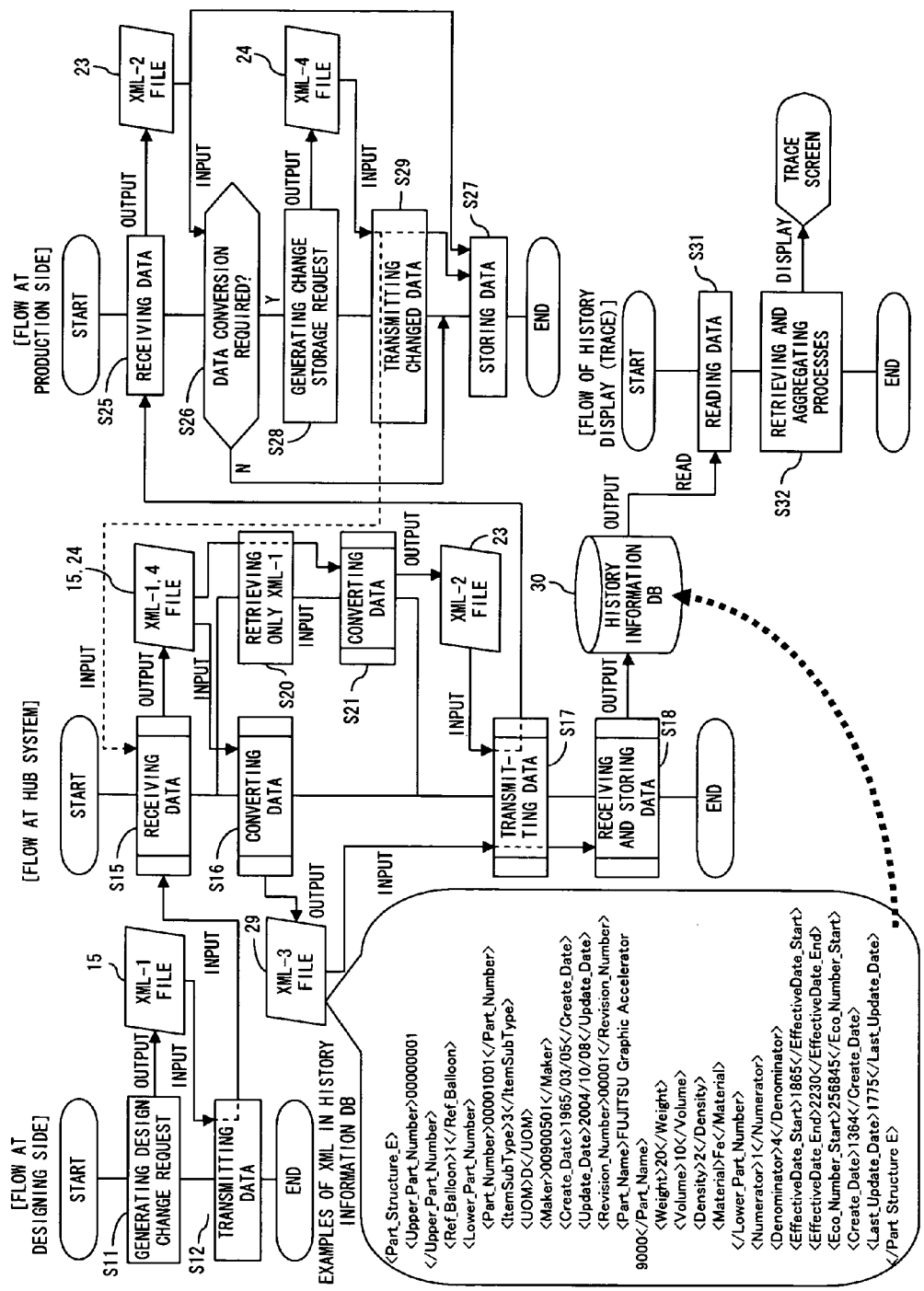
FIG. 5 is a flowchart of the process according to an embodiment of the present invention.

FIG. 5 is a detailed flowchart of the design data management and the tracing process according to an embodiment of the present invention. The process in the flowchart can be basically and roughly divided into a process of a designing side, a process of a HUB system, a process of a production side, and a tracing process, that is, a design change history displaying process. In FIG. 5, an arrow indicates a flow of data, and a process is naturally and sequentially performed downwards.

When a process is started at a designing side, new design data or design change data transmission request is generated in step S11, and the data is output as the XML-1 file 15. In step S12, data is transmitted to the HUB system using the XML-1 file 15 as input, thereby terminating the process.

At the HUB system side, data from the designing side is received in step S15, and the XML-1 file 15 is output. In step S15 as described later, the XML-4 file 24 as design change data transmitted from the production side can be received.

The XML-1 file 15 transmitted from the designing side is input to the data converting process in step S16, and, as a result, the data is output as the data format stored in the history information database 30 shown in FIG. 3, that is, as the XML-3 file 29 with the parts master data combined to the parts structure data as explained above by referring to FIG. 4, and is input to the data transmitting process in step S17. Then, for example, data is transmitted to a remote device, and the transmitted data is received in step S18, and is stored in the history information database 30.

In parallel with the above-mentioned process, in the HUB system, the contents of the XML-1 file 15 transmitted from the designing side are transmitted to the production side. That is, in the data received in step S15, only the XML-1 file 15 is retrieved in step S20, and input in the data converting process in step S21. Then, it is output as the XML-2 file 23 in the data format applicable to the process at the production side, input in the data transmitting process in step S17, and transmitted to the data production side. The first step in claim 1 of the present invention corresponds to the processes in steps S21 and S17, and the processes in steps S16 through S18.

At the production side, the data is received, and output as the XML-2 file 23. Using the XML-2 file 23 as input, it is determined in step S26 whether or not a change is required at the production side, that is, at the factory side on the data transmitted from the designing side. If a change is not required, the XML-2 file 23 is stored in the memory of the production side, thereby terminating the process.

When it is determined in step S26 that a change of data transmitted from the designing side is required, a request to store changed data is generated in step S28, and the contents are output as the XML-4 file 24. The file is input in the changed data transmitting process in step S29, transmitted to the HUB system side, and, for example, the contents of the XML-2 file 23 as the data from the designing side and the contents of the XML-4 file 24 indicating the changed data at the production side are stored in the memory at the production side in step S27, thereby terminating the process.

The XML-4 file as the design change data transmitted from the production side to the HUB system is received by the HUB system side in step S15, provided as input to the data converting process in step S16 as with the above-mentioned XML-1 file 15, converted to the XML-3 file 29 as the data format stored in the history information database 30, and stored in the history information database 30 in the processes in steps S17 and S18. The second step of claim 1 corresponds to the processes in steps S16 through S18.

Next, when the process is started in the flowchart of the tracing process, data is read from the history information database 30 in step S31. As described above, the history information database 30 can be a local device or a remote device to the HUB system, and data is output from the history information database 30, a retrieving and aggregating process is performed on the data output in step S32, and the result of the process is displayed on the trace screen as a design change history, thereby terminating the process. Thus, only by retrieving data from the design data and design change data accumulated in the history information database 30, with or without specifying an item, it is possible to display the trace of time-series design change data for each factory. By performing the tracing operation, the past configuration of the parts can also be restored.

FIGS. 6 and 7 show an example of displaying design change history trace. The design change trace indicates the design change history of a specific lower part. FIG. 6 shows a change result in the factory A. FIG. 7 shows a change result in the factory B.

When FIGS. 6 and 7 are compared with each other, the contents are the same between them except the data in line 7 shown in FIG. 7, that is, the data of a changed portion in the factory B. That is, in the factory A, a design change is made only at an instruction from the designing side while a change of design data is made independently in the factory B in addition to the design change indicated by the designing side, and a result is announced as the XML-4 file 24 to the HUB system side.

Upper part codes shown in FIGS. 6 and 7 are codes as upper parts using specified lower parts, that is, parts to be traced, and a sequence number indicates the order of processes when a structure is performed at the factory side. A numerator/denominator of an amount refers to the number of necessary parts. The unit of quantity refers to the unit of the number of necessary parts. The starting year, month, and day indicates the starting date of a design change in a factory. The ending year, month, and day indicates the term of the design. These two pieces of data of year, month, and day have great influence on the capacity of required parts for arrangement of parts performed by the production management system.

In the present embodiment, since all design data and design change data are centrally managed by the history information database 30 as described above, it is possible to perform an aggregating process on the design change data of an item by specifying the item as described above. FIGS. 8 and 9 show examples of results of the aggregating process of the design change reasons.

As shown in FIG. 8, the design change reasons are aggregated for each product. As shown in FIG. 9, the number of times of design changes made to a specific product is calculated for each month. Using the above-mentioned aggregating results, the production processes can be managed, thereby obtaining a large practical merit.

As described above, the design data management program, the design data trace program, etc. according to the present invention are explained in detail. For example, the HUB system shown in FIG. 3 can be naturally configured by a general computer system as a basic component. FIG. 15 is a block diagram of the computer system, that is, a hardware environment.

Figure 10:
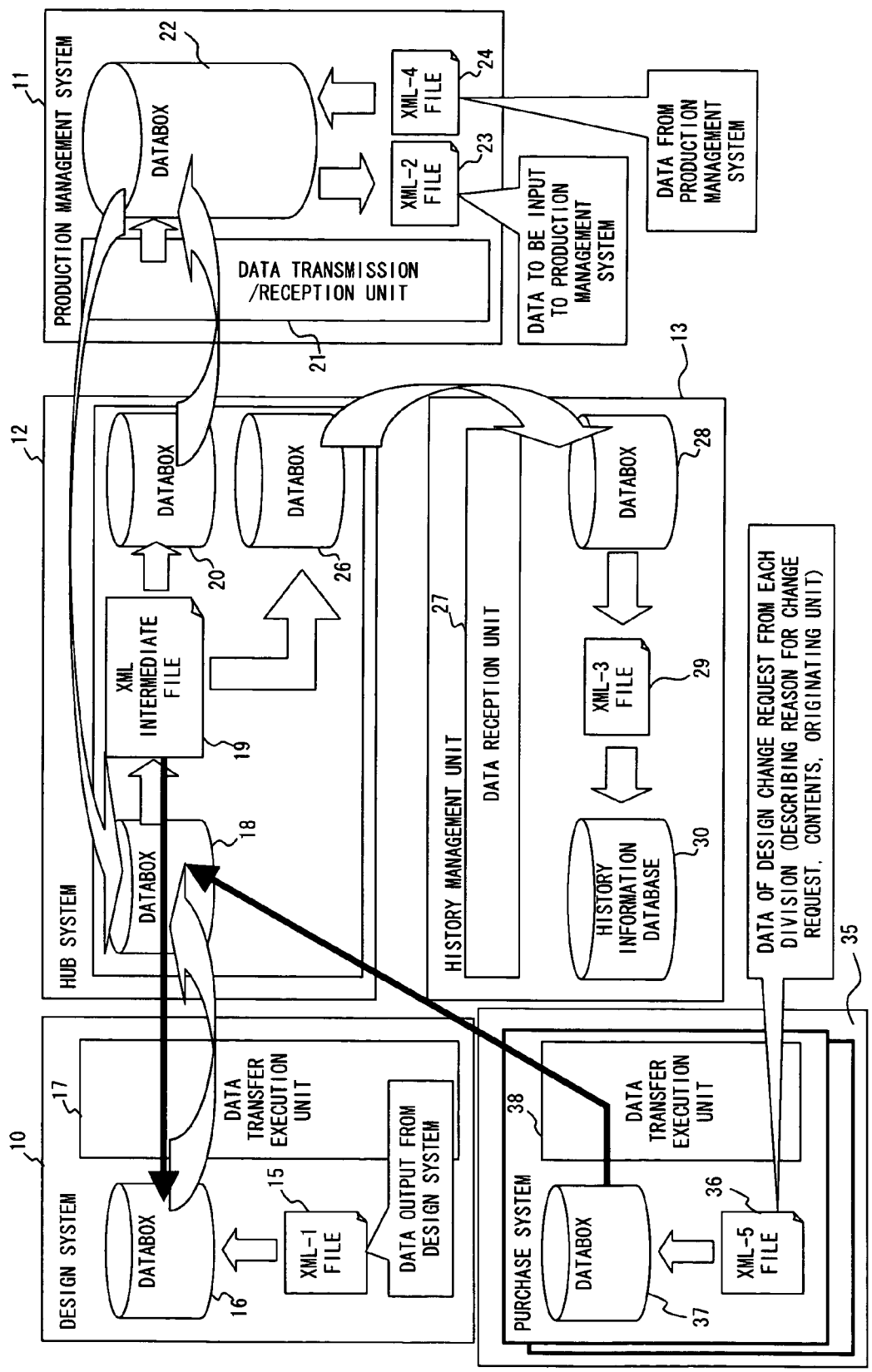
FIG. 10 shows the configuration of the system according to the second embodiment of the present invention.

FIG. 10 is a block diagram of another embodiment of the present invention.

The component also shown in FIG. 3 is assigned the same reference numeral, and the explanation is omitted here.

In a purchase system 35, the data of design change request from each division (descriptions of the reason for change request, contents, and originator) is stored in a data box 37 as an XML-5 file 36. The XML-5 file 36 is stored in the data box 18 of the HUB system 12 as the data from the purchase system 35 through a data transfer execution unit 38. Then, the data from the purchase system 35 is transferred to the history management unit 13 through the XML intermediate file 19, and the data box 26 as described above by referring to FIG. 3, and the XML-3 file 29 is finally stored in the history information database 30 through the data reception unit 27 and the data box 28. Thus, the history information database 30 of the history management unit 13 provided corresponding to the HUB system 12 stores the data from the purchase system 35 in addition to the data of the design system 10 and the data from the production management system 11, thereby performing the process explained below.

Figure 11A:
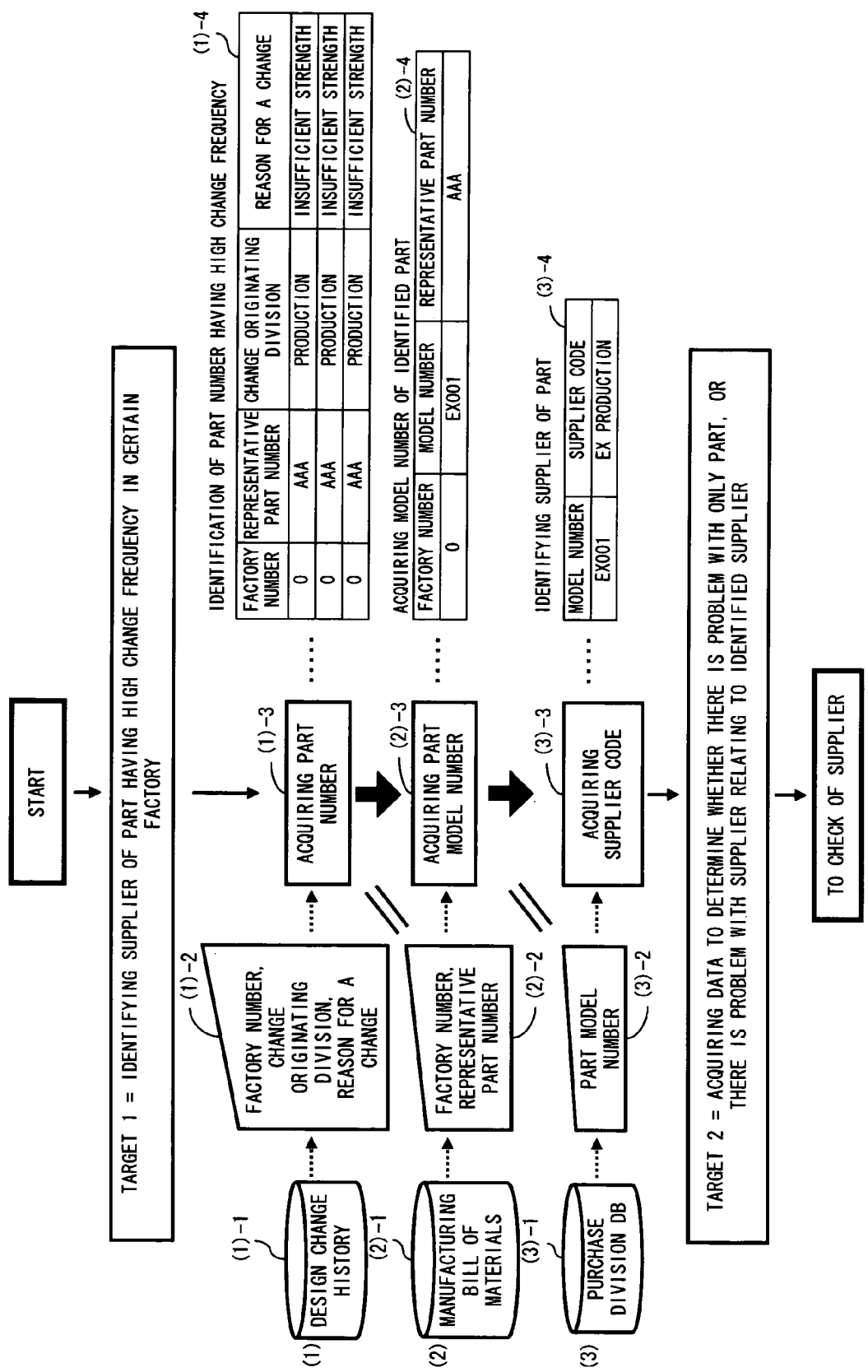
FIG. 11A is a flowchart specifying a supplier of a part having a high change frequency in a certain factory.

As shown in FIG. 11A, the supplier of the part for which changes are made frequently on a factory is identified as target 1. That is, in the procedure (1), the design change history (1)-1 is retrieved from the history information database 30, and the factory number, the change originating division, and the reason for a change are designated as shown in (1)-2, thereby obtaining the representative part number AAA indicating the insufficient strength three times in the production division having the factory number 0 as shown by (1)-3. At this time, a table of the factory number, representative part number, change originating division, and reason for a change is displayed on the viewer as indicated by (1)-4. Then, other factory number, change originating division, and reason for a change are specified, the number of parts having insufficient strength is counted for other representative part numbers, and it is determined that there are a larger number of parts having insufficient strengths of the representative part number AAA. A larger number of insufficient strengths of the representative part number AAA can be determined based on the threshold.

Next, in the procedure (2), the manufacturing bill of materials (2)-1 as the data of the production side from the history information database 30 is retrieved, the factory number and the representative part number are designated as shown by (2)-2, and the corresponding part model number EX001 is acquired as shown by (2)-3. At this time, a table of the factory number, the model number, and the representative part number is displayed on the viewer as indicated by (2)-4.

Then, in the procedure (3), the data (3)-1 from the purchase division database stored in the history information database 30 is retrieved, the part model number is designated as indicated by (3)-2, and the supplier code EX production is acquired as indicated by (3)-3. At this time, a table of a model number and a supplier code is displayed on the viewer as indicated by (3)-4.

As described above, as a part having a high design change frequency as indicated by (1)-2 and 3, the representative part number AAA is acquired. As indicated by (2)-2 and 3, the model number EX001 of the representative part number AAA of the factory number 0 is acquired, and as indicated by (3)-2 and 3, the supplier code EX production of the supplier that provides the model number EX001 is acquired. Therefore, a supplier having a high change frequency can be identified. As a part having a high change frequency, when another representative part number is acquired, the supplier is identified in the similar procedure above, and a comparison can be made as to the design change frequency of which supplier is higher.

Figure 11B:
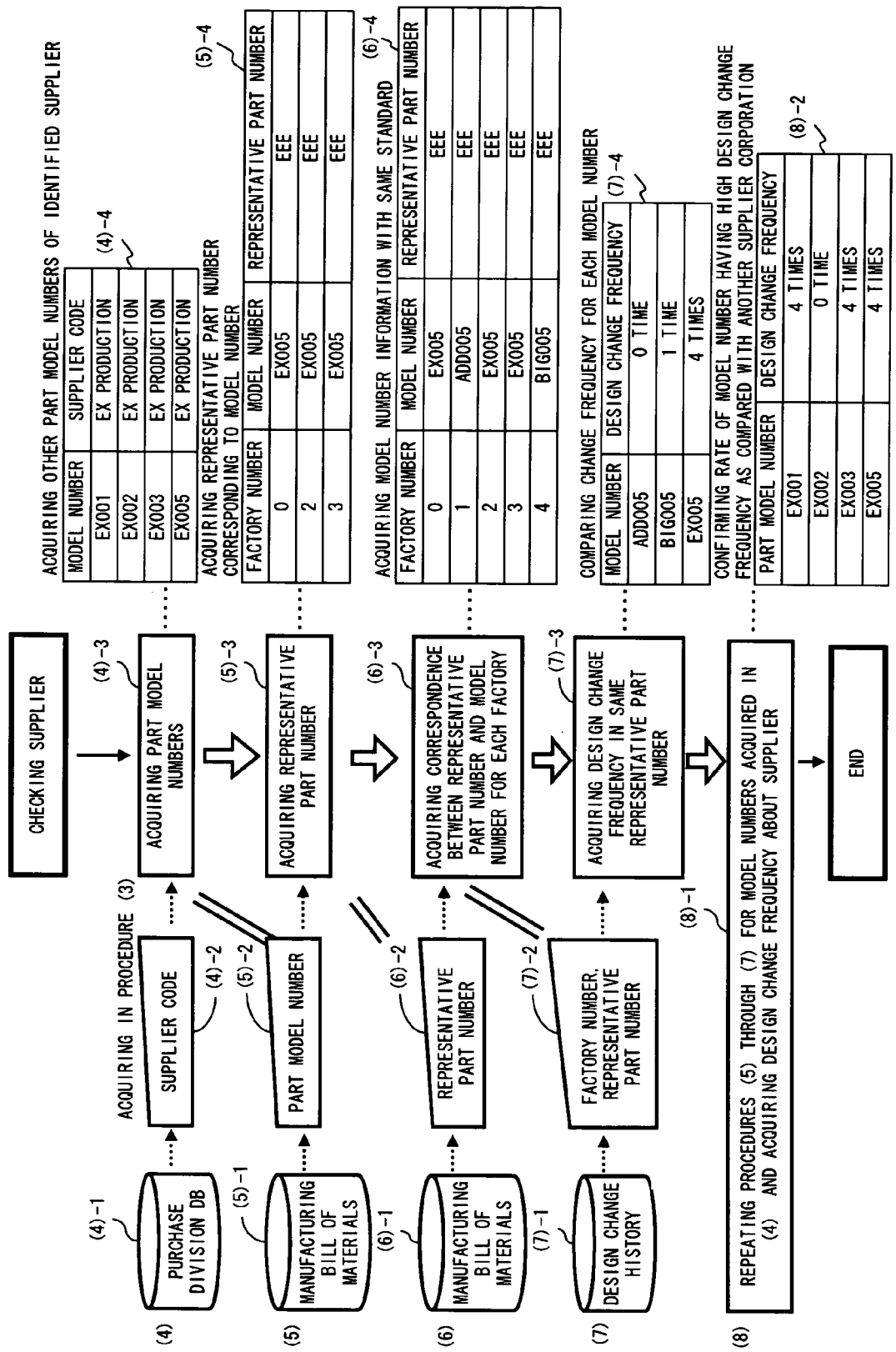
FIG. 11B is a flowchart for determination relating to an identified supplier as to whether there is a problem with only the part or there is a problem with a supplier itself.

As a target 2, the process about the identified supplier, acquiring data for determination as to whether there is a problem only with the part or there is a problem with the supplier itself is explained below by referring to FIG. 11B. FIG. 11B shows the procedure (4) in which the data from the purchase division from the history information database 30 is acquired as indicated by (4)-1, the supplier code acquired in the procedure (3) is designated as indicated by (4)-2, and a part model number is acquired as indicated by (4)-3. At this time, a correspondence table of a model number and a supplier code is displayed on the viewer (4)-4, and other part model numbers EX002, EX003, and EX005 of the designated supplier are acquired.

Next, in the procedure (5), the data of the manufacturing bill of materials (5)-1 is acquired from the history information database 30, and the part model number is designated as indicated by (5)-2, thereby acquiring the representative part number as indicated by (5)-3. At this time, a correspondence table of a factory number, a model number, and a representative part number is displayed on the viewer as indicated by (5)-4. For example, for the factory numbers 0, 2, and 3, the information that the representative part number of the model number EX005 is EEE is obtained.

Then, in the procedure (6), the data of the manufacturing bill of materials (6)-1 is acquired from the history information database 30. Based on the representative part number as indicated by (6)-2, the correspondence between a representative part number and a model number is acquired for each factory as indicated by (6)-3. That is, for the representative part number EEE, for each of the factories 0, 1, 2, 3, and 4, the model numbers EX005, ADD005, EX005, EX005, BIG005 are respectively identified. Based on the model number, each supplier is identified. At this time, the viewer (6)-4 displays the table of a factory number, a model number, and a representative part number.

Next, in the procedure (7), as indicated by (7)-1, the design change history is acquired from the history information database 30 and the factory number and the representative part number are designated as indicated by (7)-2. As indicated by (7)-3, it is obtained that the design change frequencies of the model numbers ADD 005, BIG 005, and EX005, all of which correspond to the same representative part number EEE, that is, the design change frequencies of the suppliers corresponding to the respective model numbers are 0 time, 1 time, and four times. As indicated by (7)-4, the design change frequency of the model number EX005 is four times. Therefore, the EX production as a supplier providing the model number EX005 has the highest fault rate about the part of the representative part number EEE.

Then, in the procedure (8), as indicated by step (8)-1, other model numbers EX002, EX003, and EX005 of the supplier code EX production obtained in step (4)-3 are acquired, the corresponding representative part number is obtained as indicated by (5)-3, the model number of another supplier corresponding to the representative part number is obtained as indicated by (6)-3, and the design change frequency of the model number as indicated by (7)-3 is acquired. Thus, the model numbers of other suppliers for the representative part numbers designated by the model numbers EX002, EX003, and EX005 of the supplier code EX production are informed, thereby the design change frequency of another supplier is output for each model number. Then, as indicated by (8)-2, the design change frequencies of the part model numbers EX001, EX002, EX003, and EX005 of the supplier code EX production are respectively four times, 0 time, four times, and four times. Therefore, the design change frequencies of the model numbers of another supplier corresponding to the representative part numbers corresponding to these model numbers are checked, and it is determined whether or not the design change frequency of the supplier code EX production is higher than the design change frequency of the other supplier for the same representative part number.

Thus, it can be determined not only that the representative part EEE corresponding to the model number EX005 of the supplier. EX production has a higher design change frequency, but also whether or not another model number of the supplier EX production corresponding to another representative part number has a higher design change frequency than another supplier.

FIGS. 12A through 12I show a more practical process on the targets 1 and 2 shown in FIGS. 11A through 11B. In FIGS. 12A through 12I, the same components shown in FIGS. 11A and 11B are assigned the same reference numerals, and the explanation is omitted here.

Since the procurement of parts and the equipment step are different for each factory, a problem can be effectively detected by analyzing the design change history for each factory. If it is proved that a detected problem also holds true with other factories, company-wide measures can be taken. For example, if it is found that one supplier delivers various parts with design change rate being higher than that of other suppliers to each factory, means for the supplier can be determined by the entire corporation.

It is necessary to detect the supplier that is the cause of a problem when improvement of the purchase division is aimed at. To attain this, it is first necessary to find a part which is the cause of a problem.

In the procedure (1), in the design change history indicated by (1)-1, as indicated by (1)-1-1, a part is managed by a representative part number for each factory, and the correspondence information about the part and the reason for a change of a change originating division is also managed. Based on the information, the "part with the problem" is identified. That is, as indicated by (1)-1-1, a factory number of 0, 1, 2, 3, and 4 are shown for each factory. For each part, AAA, . . . ABC, BBB, BCD, CDE, . . . are shown as representative part numbers respectively. A change originating division can be the production, purchase, sales, design, . . . . A reason for a change can be insufficient strength, cost reduction, defective combination, specification change, design change, function amendment, etc.

The problem with a part can be caused by various factors such as the price, quality, etc. For example, assume that the quality improvement is to be performed. As indicated by (1)-2, in the factory managed as "factory number=0", the representative part number ABA is retrieved. That is, in the table indicated by (1)-1-1, the factory number=0, the representative part number AAA, the change originating division "production", and the reason for a change "insufficient strength" are specified, and "a part practically used in the production division, and design-changed due to the problem about the quality (insufficient strength, etc.)" is retrieved. Then, on the viewer, as indicated by (1)-4, three occurrences of insufficient strength as a reason for a change is detected for the factory number 0, the representative part number AAA, and the change originating division being the production. That is, in the above-mentioned operation, the representative part number AAA is acquired as a part having design changes for or more than a predetermined number of times.

Figure 12A:
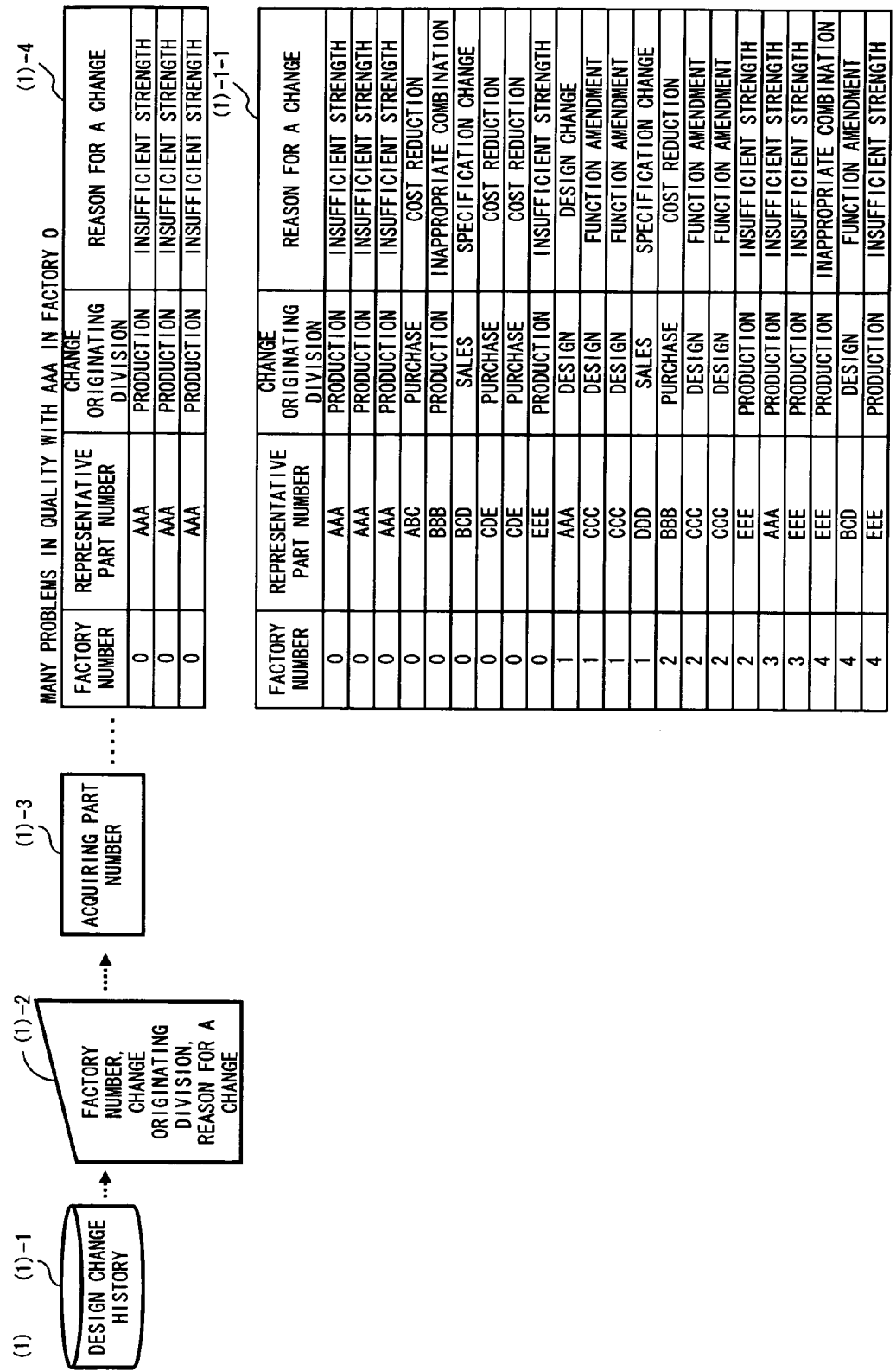
FIG. 12A is a flowchart specifying a supplier having a high change frequency relating to a certain factory.
Figure 12B:
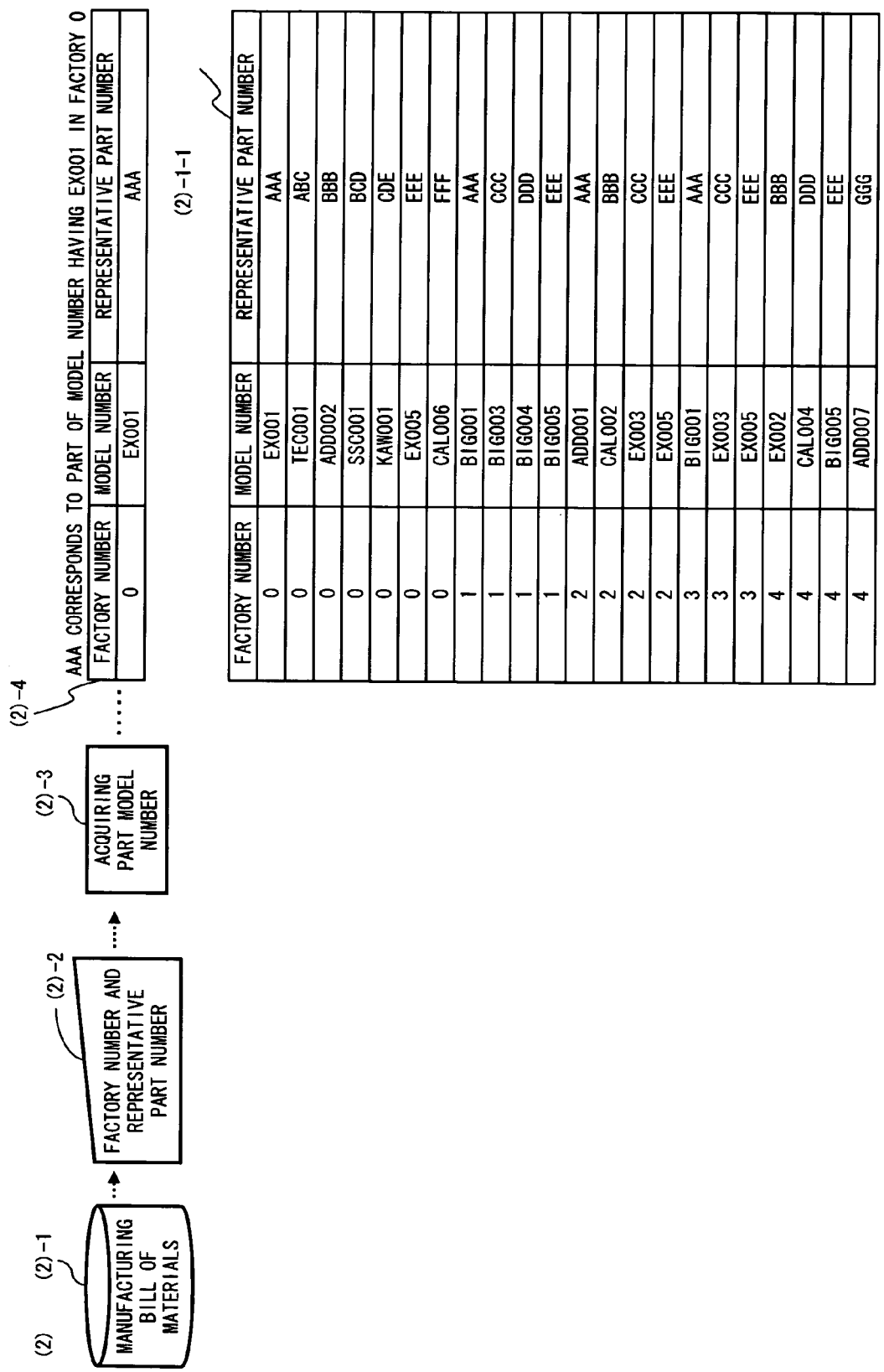
FIG. 12B is a flowchart specifying a supplier having a high change frequency relating to a certain factory.

Next, in the procedure (2) shown in FIG. 12B, as indicated by (2)-1-1, the manufacturing bill of materials (2)-1 is designated, that is, as indicated by (2)-1-1 on the manufacturing bill of materials, the correspondence between the representative part number and the model number at the current time point is managed for each factory. As indicated by the table (2)-1-1, a table having the factory numbers 0, 1, 2, 3, and 4, and the model numbers EX001, TEC001, ADD002, SSC001, KAW001, . . . BIG005, EX005, . . . , EX005, . . . ,EX003, . . . , ADD005, and the corresponding representative part numbers AAA, ABC, BBB, BCD, CDE, EEE, EEE, . . . CCC, . . . GGG is provided. In the bill of materials (2)-1-1, the model number EX001 of a part having a problem can be acquired by specifying the factory number 0 and the representative part number AAA to perform a search.

The same part can be procured from a plurality of part suppliers, and each part is identified by a model number. As indicated by (2)-2, it is necessary to identify a model number from a representative part number and a factory number.

Figure 12C:
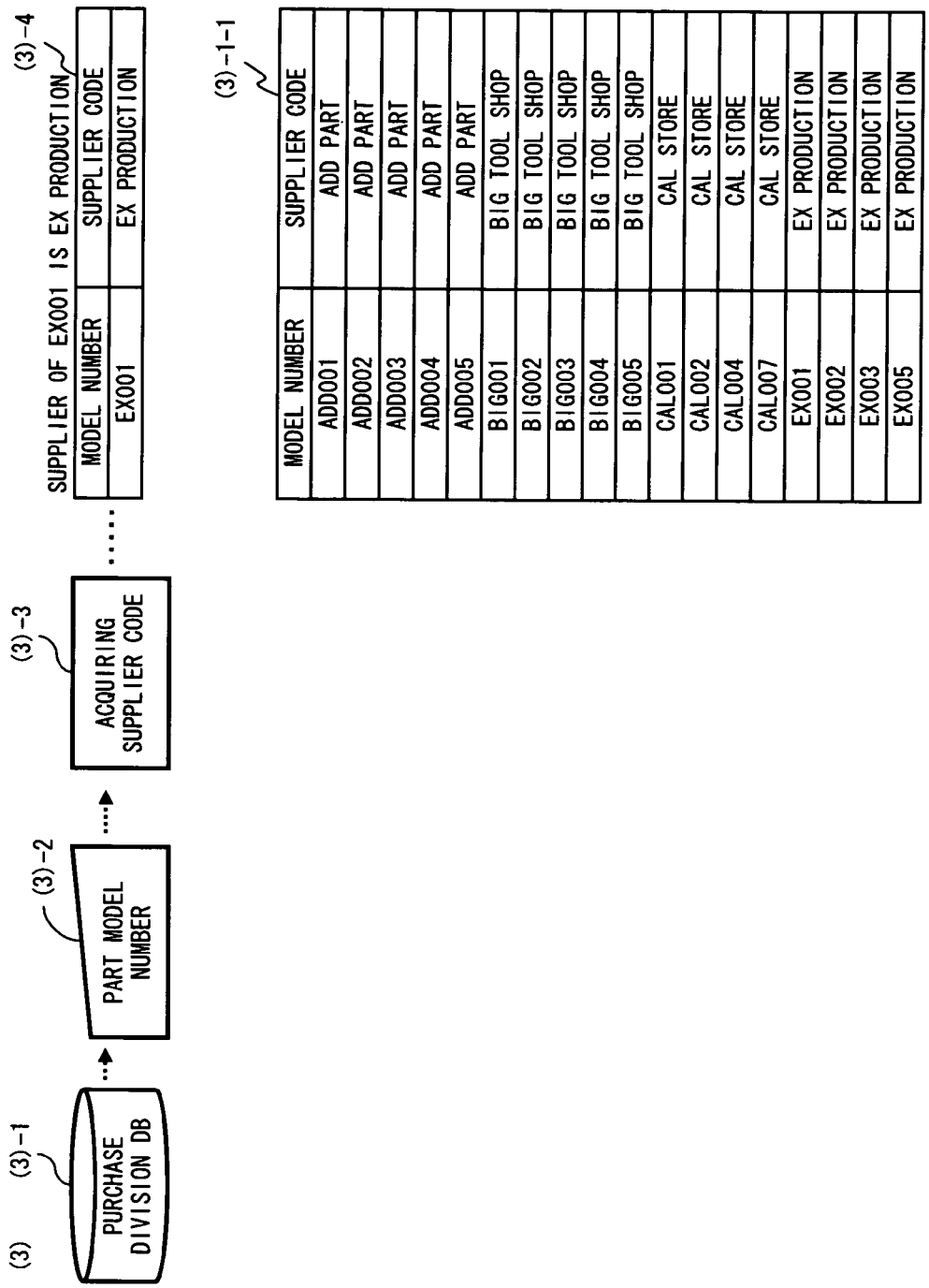
FIG. 12C is a flowchart specifying a supplier having a high change frequency relating to a certain factory.

Next, as indicated in the procedure (3) shown in FIG. 12C, the purchase division data (3)-1 as a table (3)-1-1 is used in managing the correspondence among the model numbers ADD001, ADD002, . . . , ADD005, BIG001, . . . , BIG005, . . . , CAL001, . . . , EX001 and the supplier codes ADD part, ADD part, . . . , ADD part, . . . , BIG tool shop, CAL store, EX production, EX production, EX production, EX production. If the model number of the part having a problem can be acquired, the supplier of the part can be acquired. By specifying the part model number EX001, the supplier can be identified as the EX production.

Figure 12D:
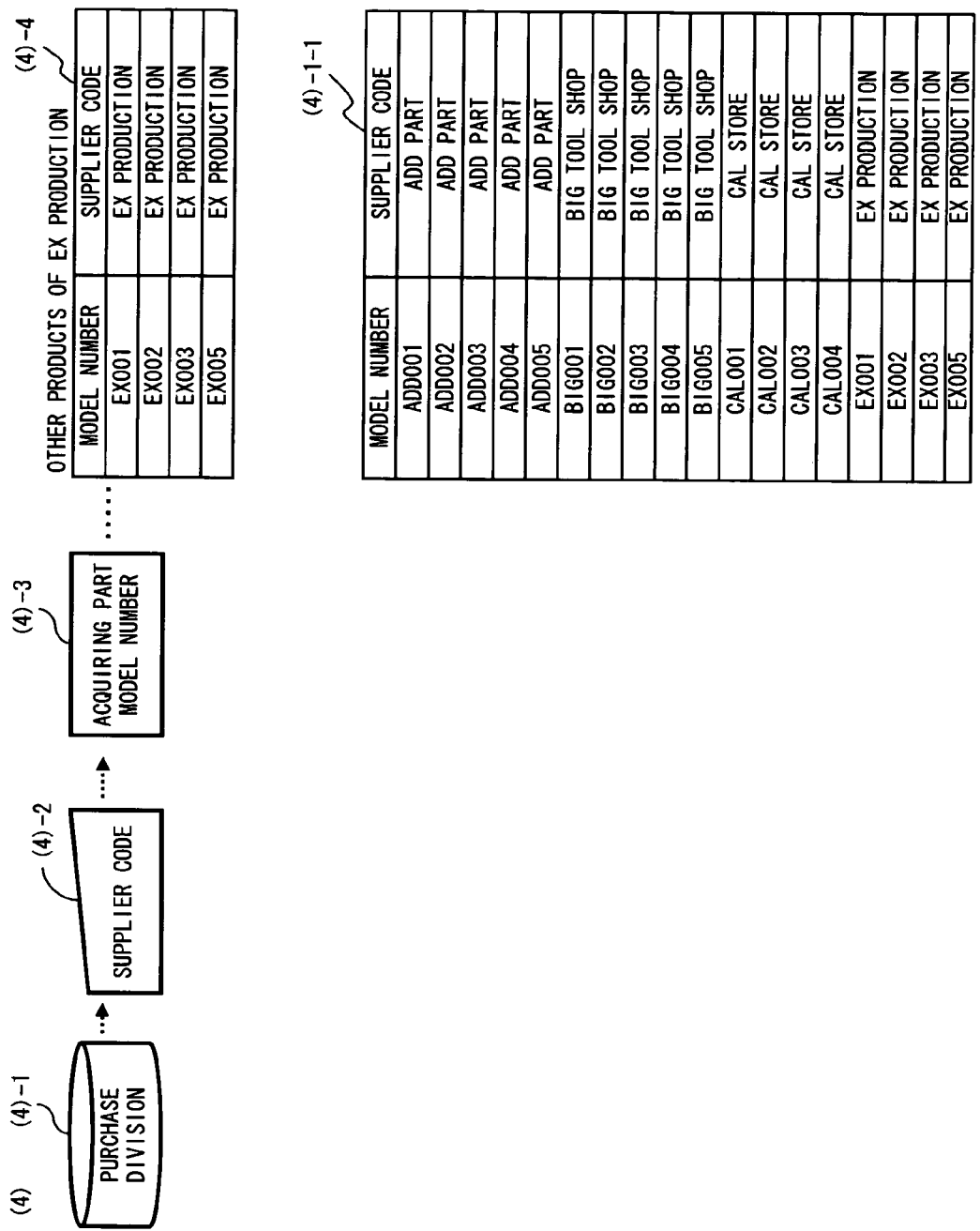
FIG. 12D is a flowchart for determination relating to a specific supplier as to whether there is a problem only with the part, or there is a problem with a supplier itself.

Next, in the procedure (4) shown in FIG. 12D, the purchase division database (4)-1 is used in managing the correspondence among the model numbers ADD001, . . . , ADD005, BIG005, EX001, EX002, EX003, EX005 and the supplier codes ADD part, BIG tool shop, EX production, EX production, EX production, EX production as indicated by (4)-1-1.

The above-mentioned time points (3)-1, (3)-2, and (3)-3, "a supplier of a certain faulty part" can be identified. Relating to the supplier EX production, it can be checked whether there is a problem only with "a certain faulty part" or the supplier itself has a problem. By inversely tracing procedures of identifying the supplier from (1)-1 through (3)-3, it is checked whether or not another part of the same supplier has a problem as compared with a part of another supplier. In this embodiment, the "EX production" is identified as the supplier. Therefore, the model numbers of other parts purchased from the EX production, that is, EX002, EX003, and EX005 other than the model number EX001 are acquired.

That is, by specifying the supplier code EX production, the model numbers EX001, EX002, EX003, and EX005 of the parts delivered by the supplier can be identified, and the correspondence table between the model number and the supplier code is displayed on the viewer as indicated by (4)-4. In the following procedure, the part having "the model number of EX005" is checked.

Figure 12E:
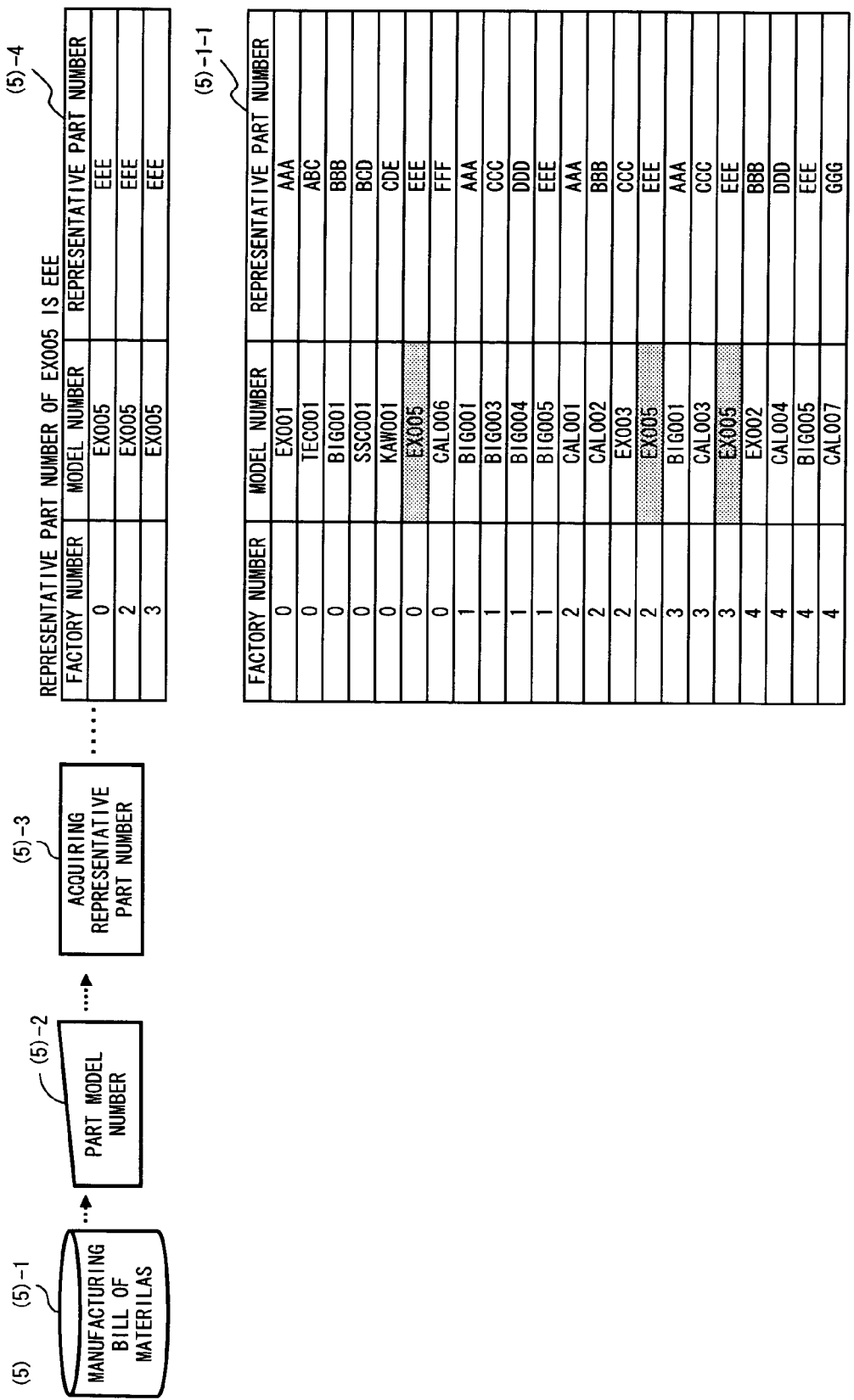
FIG. 12E is a flowchart for determination relating to a specific supplier as to whether there is a problem only with the part, or there is a problem with a supplier itself.

In the procedure (5) shown in FIG. 12E, the table shown in manufacturing bill of materials (5)-1 is used in managing the correspondence among the factory numbers 0, 1, 2, and 3, the model numbers EX001, TEC001, BIG001 through EX005, . . . , Ex005, . . . , EX005, and the representative part numbers AAA, ABC, BBB, . . . , EEE, . . . , EEE, . . . , EEE as indicated by (5)-1-1. Then, the information of the representative part number EEE is acquired from the model number EX005. After that, it is checked in which factory and in accordance with what standard the part with the representative part number EEE is used. Thus, the "model number EX005" is used as the "representative part number=EEE" in the factories 0, 2, and 3. Then, the correspondence table among the factory numbers 0, 2, and 3, the model number EX005, and the representative part number EEE is displayed on the viewer as shown in (5)-4.

Figure 12F:
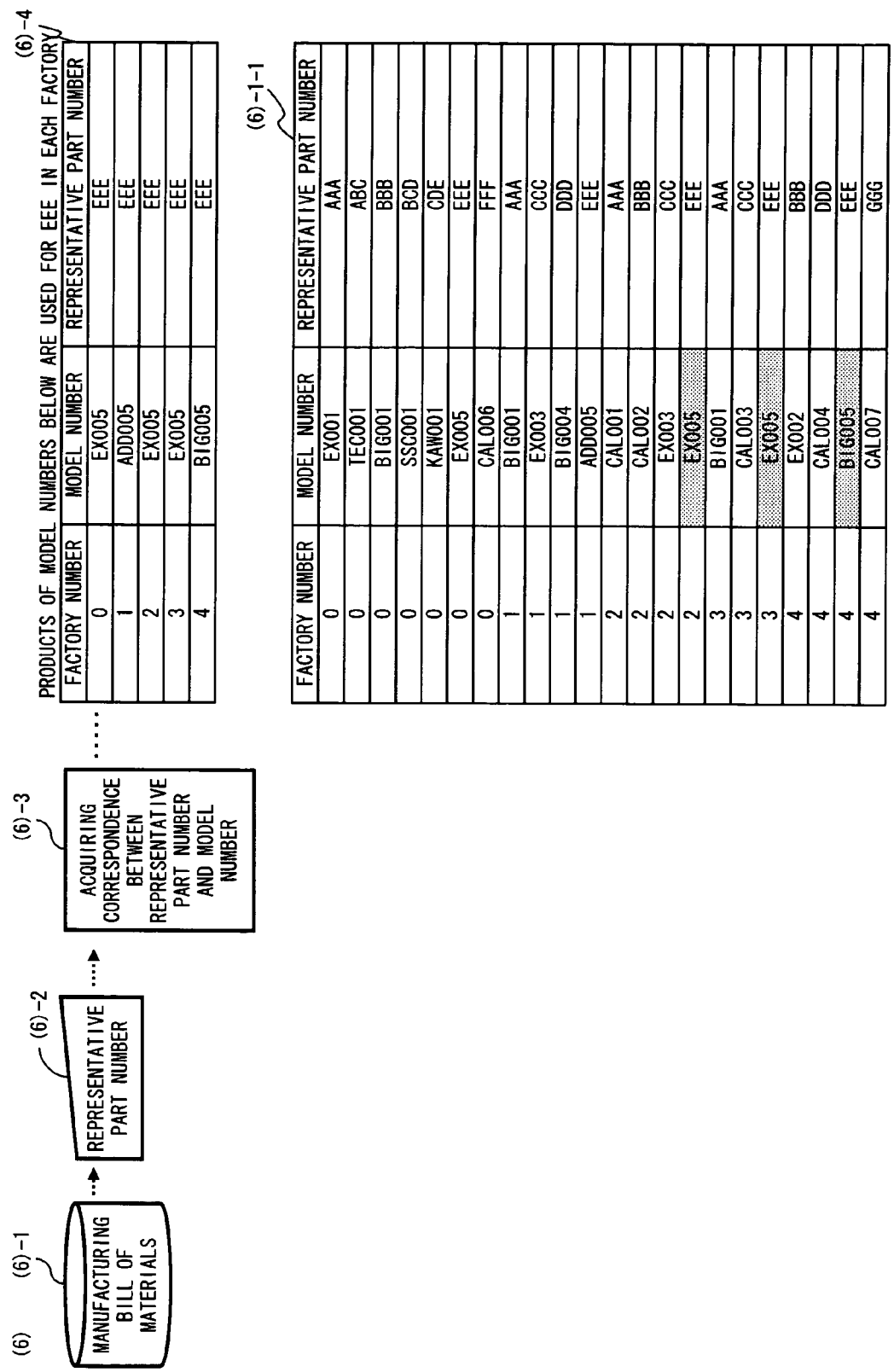
FIG. 12F is a flowchart for determination relating to a specific supplier as to whether there is a problem only with the part, or there is a problem with a supplier itself.

Next, in the procedure (6) shown in FIG. 12F, the manufacturing bill of materials (6)-1 is used in managing the correspondence among the factory numbers 0, 1, 2, 3, and 4, the model numbers EX001, TEC001, BIG001, . . . , EX005, . . . , ADD005, EX005, . . . , EX005, . . . , BIG the representative part numbers AAA, ABC, BBB, . . . , DEE, EEE, EEE, EEE, and EEE as shown in the table (6)-1-1.

Up to steps (5)-1, (5)-2, and (5)-3, by searching for the information relating to "EX005" in the manufacturing bill of materials, the use with the standard of the representative part number "EEE" is identified.

Since the final purpose is to compare the number of faults with that of another supplier relating to the same standard "EEE", the representative part number "EEE" is specified in the same manufacturing bill of materials, and the model number is retrieved. As a result, it is found that the model number "ADD005" of another supplier is used in "factory 1", and the model number "BIG005" is used in "factory 4". The model number "EX005" of the EX production is used in the "factory 0", "factory 2", and "factory 3". The representative part number EEE corresponds to the model numbers EX005, ADD005, EX005, EX005, BIG005 as indicated by (6)-4 in each of the factoring 3, and 4 as displayed on the viewer.

Figure 12G:
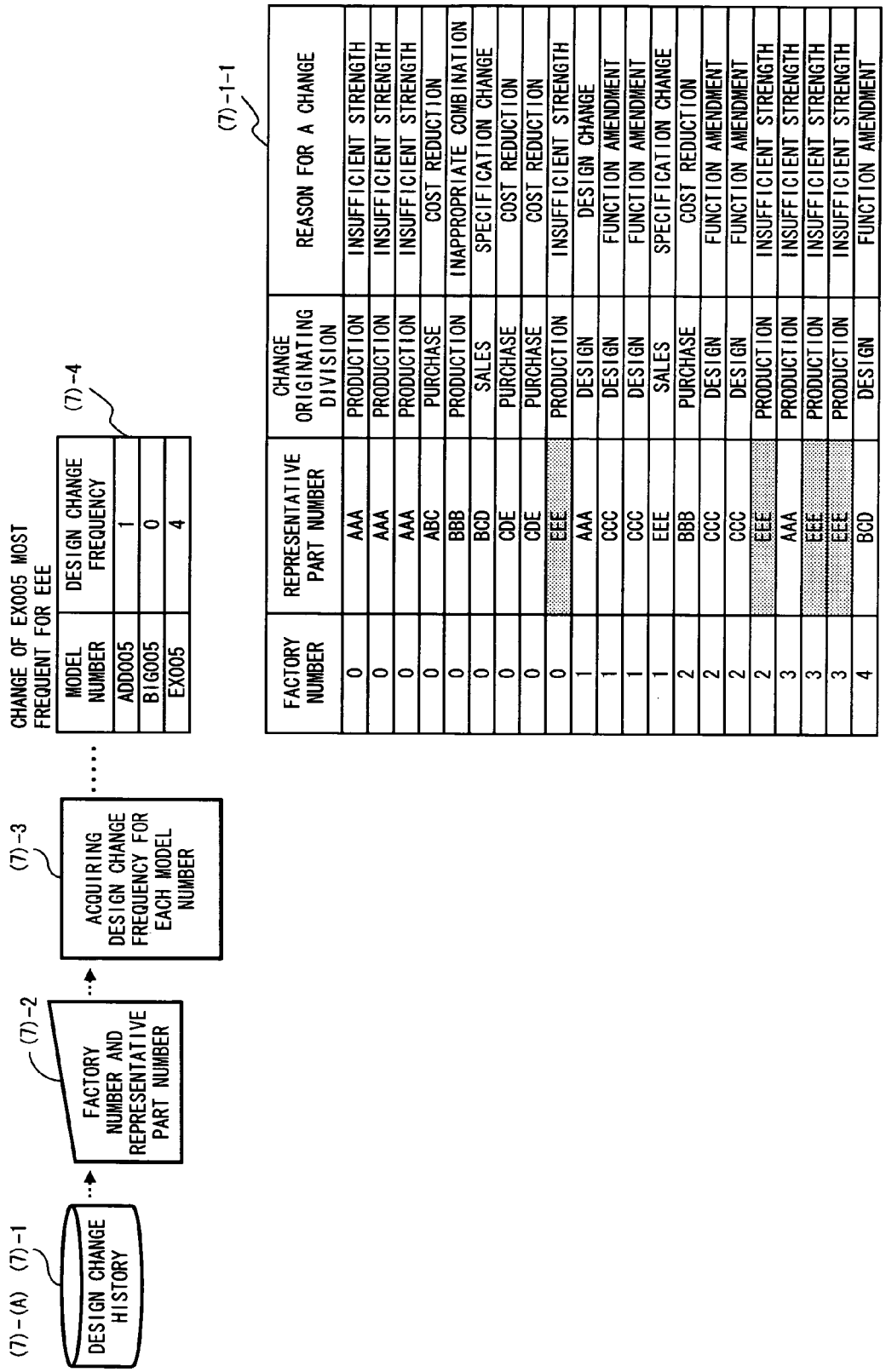
FIG. 12G is a flowchart for determination relating to a specific supplier as to whether there is a problem only with the part, or there is a problem with a supplier itself.

Next, in the procedure (7)-(A) shown in FIG. 12G, the design change history data (7)-1 is managed as correspondence among the factory numbers 0, 1, 2, 3, and 4, the representative part numbers AAA, ABC, . . . , EEE, . . . , the change originating divisions production, . . . , purchase, . . . , production, . . . , sales, production, and insufficient strength, . . . , cost reduction, insufficient strength, . . . , as shown in (7)-1-1. In the design change history, the representative part number EEE is read as follows, and the retrieval and aggregation are performed as shown in step S32.

For example, for the EX005, the value "the factory number is 0, 2, or 3" is obtained. Therefore, "factory number is 0, 2, or 3" is set as a retrieval condition in addition to "representative part number=EEE" and a retrieval process is performed. What is output is the design change frequency of the EX005. The value "the design change frequency of EX005=4 times" is stored. Similarly, design change frequencies, that is, once and 0 time, which are stored after retrieved for all the model numbers ADD005 and BIG005 obtained in (6), is calculated, thereby indicating the EX005 as a part having the most serious problem relating to the representative part EEE. Thus, in the factory 0, after the retrieval of the part EX001 having a design change, the supplier EX production is detected. By checking the products of the EX production in the entire corporation, the problem with the product of EX005 can be found.

Figure 12H:
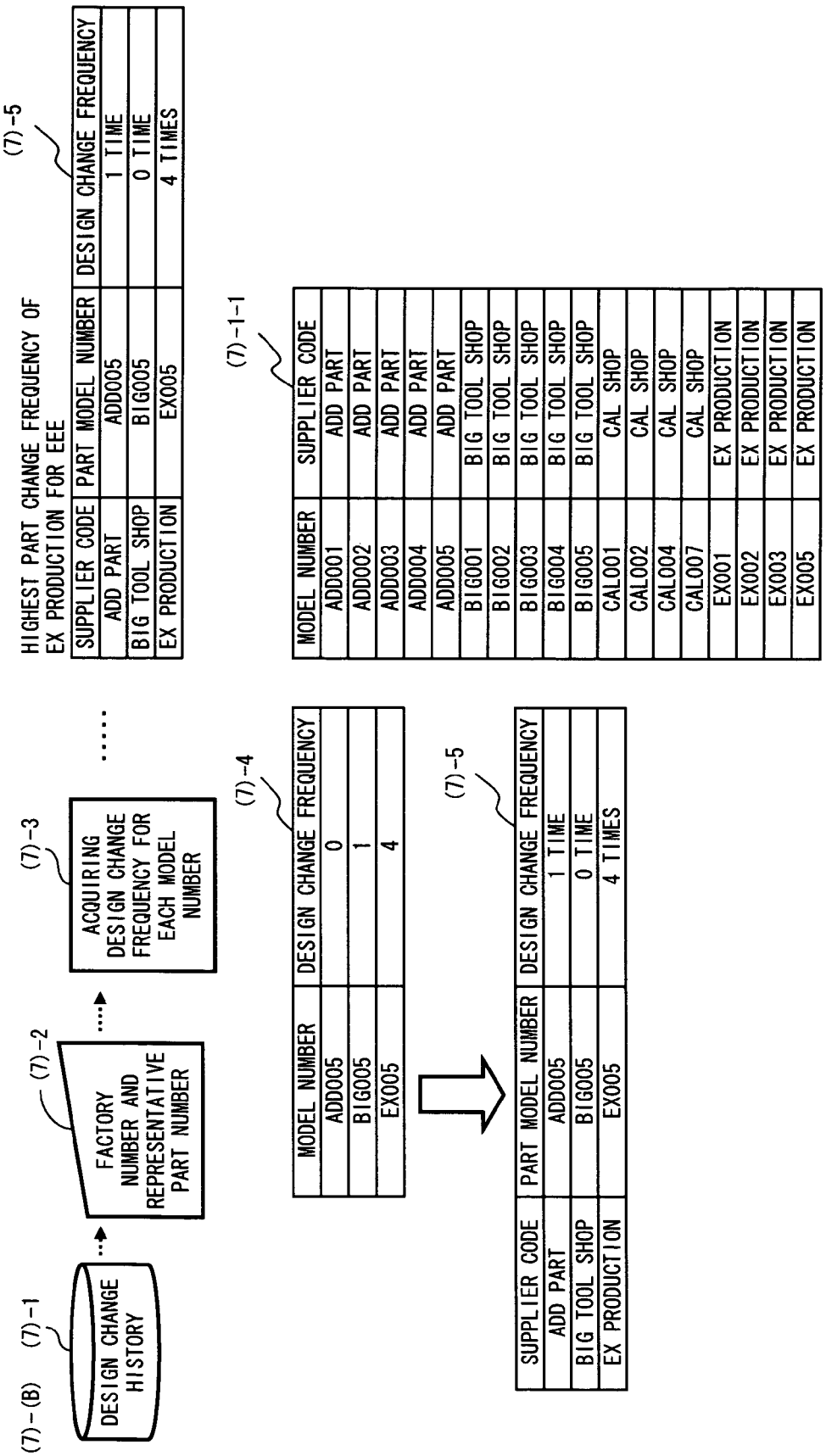
FIG. 12H is a flowchart for determination relating to a specific supplier as to whether there is a problem only with the part, or there is a problem with a supplier itself.

Next, in the procedure (7)-(B) in FIG. 12H, the purchase database is used in managing the correspondence table of ADD001, ADD002, . . . , ADD005, . . . , BIG005, . . . , EX005, and the supplier code ADD part, ADD part, . . . , ADD part, . . . , BIG tool shop, . . . , EX production as indicated by (7)-1-1, and in the same procedure as (3) above, the supplier corresponding to the model number is obtained from the purchase database. From the design change frequency of the part model number indicated by (7)-4, the design change frequency of the supplier indicated by (7)-5 is shown. That is, the viewer displays the correspondence among the supplier codes ADD part, BIG tool shop, and EX production, the part model number as ADD005, BIG005, EX005, and the design change frequency as once, 0 time, and four times. Then, the design change frequency of the supplier EX production is four times, which indicates a higher frequency than once and 0 time, that is, the design change frequencies of other suppliers ADD part and BIG tool shop.

Figure 12I:
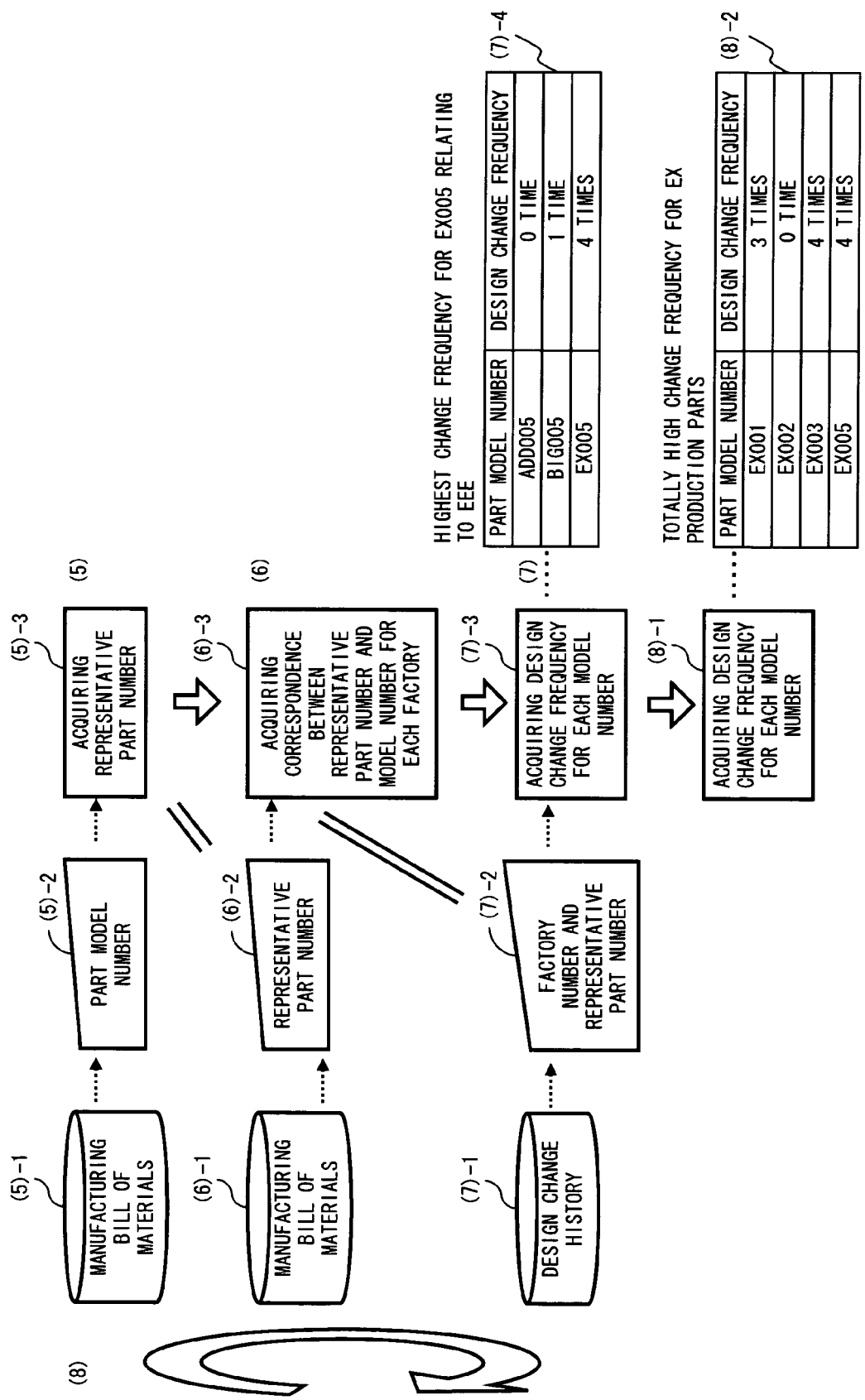
FIG. 12I is a flowchart for determination relating to a specific supplier as to whether there is a problem only with the part, or there is a problem with a supplier itself.

Next, in the procedure (8) shown in FIG. 12I according to the procedures (5) through (7), "EX005" as one of the part of the "EX production" indicates a high design change frequency as compared with other suppliers' products within the same standard. The procedures (5) through (7) are repeatedly performed for all parts of the "EX production" and the entire "EX production" is checked. That is, while the design change frequency of the EX005 is four times, the design change frequencies of other part model numbers EX001, EX002, EX003 are respectively three, zero, and four times. Although not shown in the attached drawings, assume that the design change frequencies of the part model numbers of other suppliers corresponding to the part model numbers are checked relating to the same part numbers, the design change frequency of each model number is less than three, zero, and four times respectively for the model numbers EX001, EX002, and EX003. At this time, the design change frequencies of the part model numbers EX001, EX002, and EX003 other than the part model number EX005 supplied from the supplier EX production are also more than other suppliers. It indicates that there is a problem with the parts from the EX production. That is, the part of the EX production can more easily cause a problem than parts of other suppliers also with model numbers other than EX005.

Thus, when it is clearly known that a change of one part is conspicuous in one factory, the process is not terminated only on the part, but a supplier of the part is identified, the design change frequency is acquired for other parts supplied from the supplier to other factories to compare with the design change frequency of the same part of another supplier having a different part model number and the same representative part number. If the design change frequency of the part model numbers EX001, EX002, and EX003 is high, it is found that there is also problem with other products from the supplier EX production.

Figure 13:
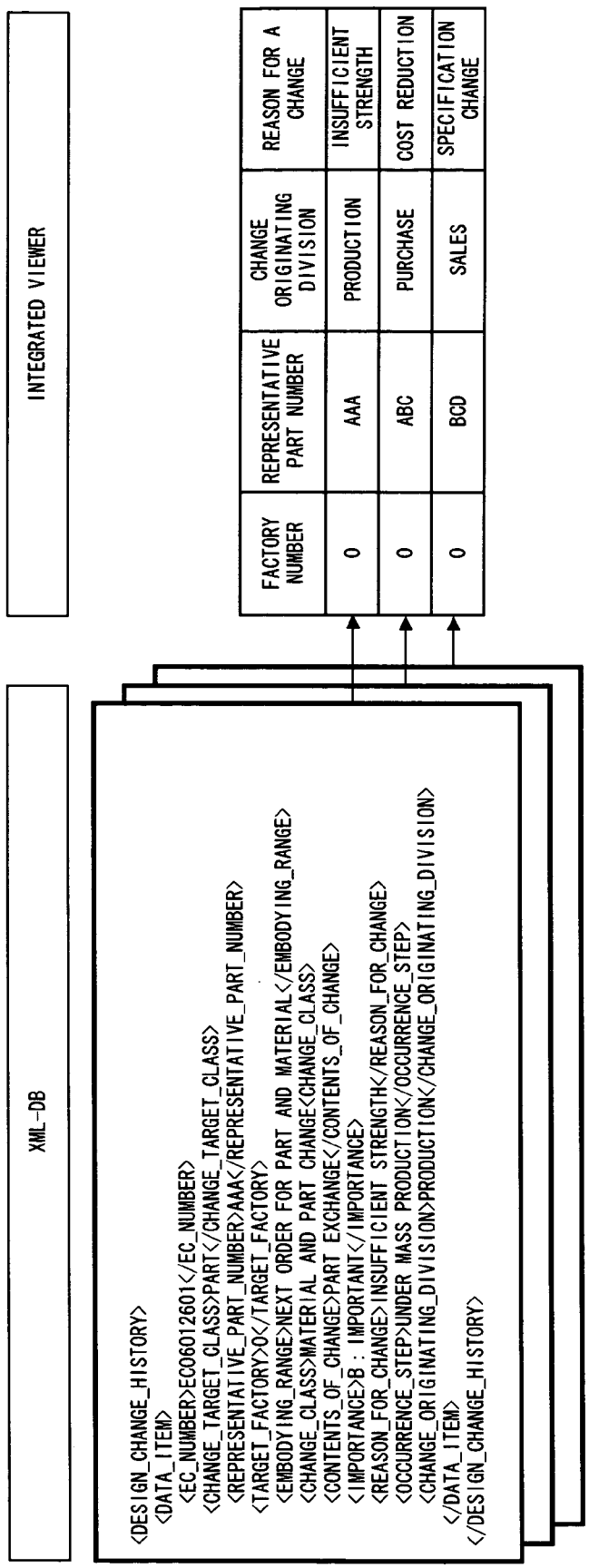
FIG. 13 is an explanatory view of the process of displaying on a viewer in a table form from a database.

FIG. 13 shows the XML database of the design change history corresponding to (1)-1-1 shown in FIG. 12A. FIG. 13 also shows that the factory number, the representative part number, the change originating division, and the reason for a change are extracted from the XML database and displayed on the integrated viewer as a table. The data stored in an XML form can be output as a table form and statistically used on the integrated viewer. Furthermore, the record in the XML database corresponds to a row in a table form. In this case, a displayed item and itemization can be optionally designated without a change in retrieving speed, etc.

Figure 14:
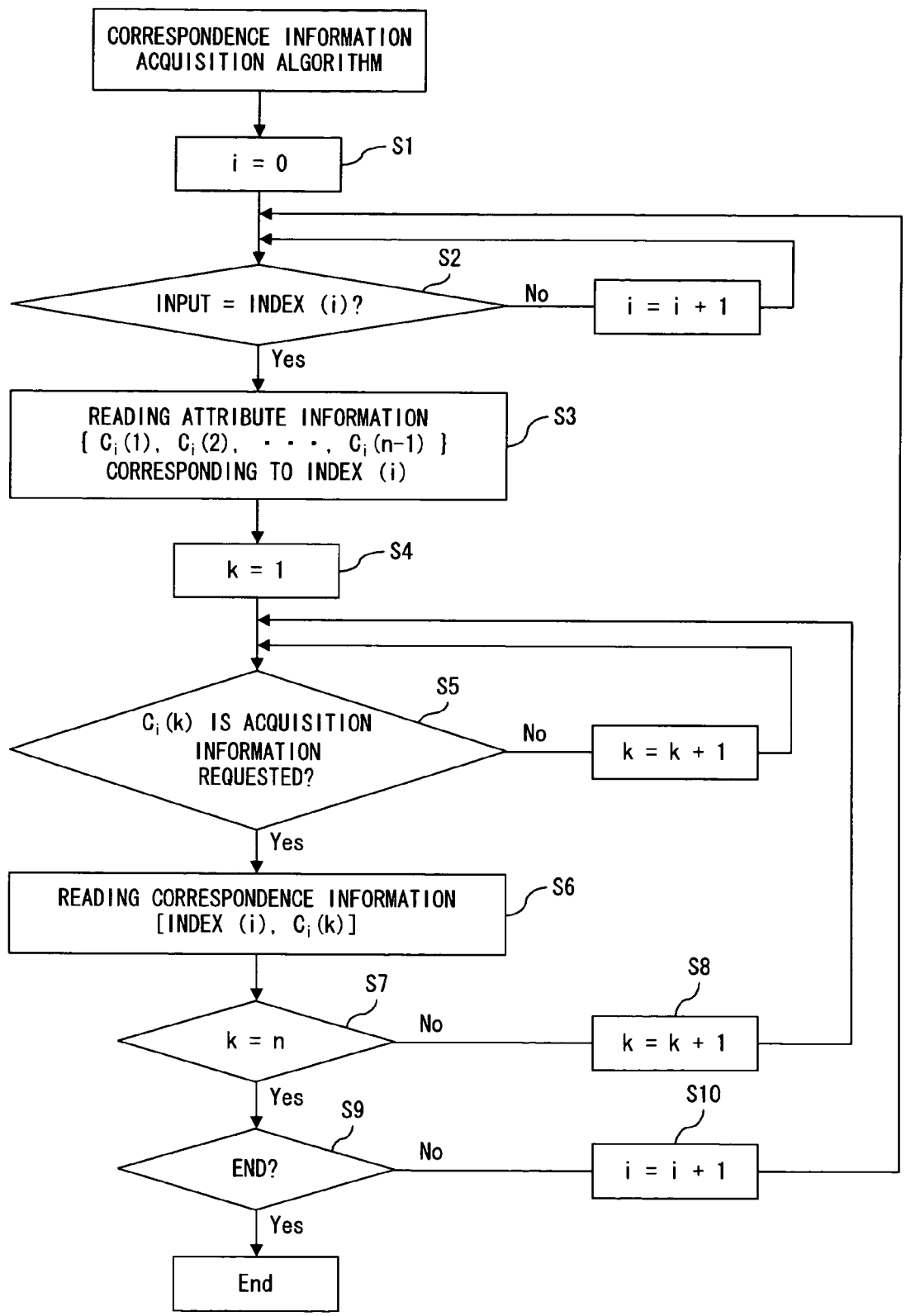
FIG. 14 is a flowchart of obtaining correspondence information by specifying a specific information from a storage device.

FIG. 14 is a flowchart of the correspondence information acquisition algorithm of the present invention as a base of the retrieving process in step S32 shown in FIG. 5. Generally, a database comprises a set of records having n attributes in each record constituted by a plurality of rows of i=0, 1, 2, ... .In n attributes, In n attributes, one is defined as an index (i). The database is retrieved by the correspondence information acquisition algorithm when input is specified by the comparison between the input character string and the index (i) as an attribute in the records. Then, from another (n−1) attribute information {Ci(1), Ci(2), ... , Ci(n−1)} excluding an index (i), the correspondence information Ci (k), k=1, 2, ... , n in which the input and index (i) match is acquired. In this case, when the input includes a plurality of attributes, for example, when the input is {a factory number, a change originating division, a reason for a change}, it is assumed that the index (i) to be compared has also the same number of attribute set, that is, {a factory number, a change originating division, a reason for a change}. Also in this case, it is assumed that correspondence information [index (i), Ci (k)] can be obtained from other attribute set {Ci (1), Ci (2), ... , Ci (n−1)} in the record.

In step S1, the starting address of the database retrieval is initialized with i=0. In step S2, the input and the index (i) in the record i is compared. If they do not match, the value is incremented and control is passed to the next record i+1. If they match, the presence of the record i corresponding to the character string of the specified input is confirmed, and control is passed to step S3. At this time, for the subsequent processes, the matched number is counted. In step S3, the attribute information {Ci (1), Ci (2), ... , Ci (n−1)} corresponding to the index (i) is read. The obtained attribute information is retrieved from the head and requested correspondence information is acquired. Therefore, the initialization is performed with k=1 in step S4. In step S5, if Ci (k) is not requested, k is incremented, and the record i is continuously retrieved. If it is requested, control is passed to step S6. In step S6, the correspondence information [index (i), Ci (k)] is read. By the determination about the termination of k in step S7 and the increment operation about k in step S8, and the determination about the termination of i in step S9 and the increment operation about i in step S10, all requested correspondence information Ci (k) is acquired.

In FIG. 12A, using the input={factory number=0, change originating division "production", reason for a change "insufficient strength"} as a key, the correspondence information {index (0), AAA}, {index (1), AAA}, and {index (3), AAA} with Ci (k)=AAA is acquired by the correspondence information acquisition algorithm.

In FIG. 12B, using the input={factory number=0, representative part number AAA} as a key, the model number having C0 (1)=EX001 is acquired by the correspondence information acquisition algorithm.

In FIG. 12C, using the input={part model number=EX001} as a key, the supplier code of C14 (1)=EX production is acquired with i=14 by the correspondence information acquisition algorithm from the record set of i=0~17. i=0~17 is the assignment of values to records from top to bottom in the figure (3)-1-1.

In FIG. 12D, using the input={supplier code=EX production} as a key, the correspondence information {EX production, C14 (1)=EX001}, {EX production, C15 (1)=EX002}, {EX production, C16 (1)=EX003}, and {EX production, C17 (1)=EX005}, are acquired according to the correspondence information acquisition algorithm. i=0~17 is the assignment of values to records from top to bottom in the figure (4)-1-1.

In FIG. 12E, using the input={part model number=EX005} as a key, {C5 (1)=0 (factory number), C5 (2)=EEE (representative part number)}, {C14 (1)=2 (factory number), C14 (2)=EEE (representative part number)}, and {C17 (1)=3 (factory number), C17 (2)=EEE (representative part number)} are acquired by the correspondence information acquisition algorithm from the record set of i=0~21. i=0~21 is the assignment of values to records from top to bottom in the figure (5)-1-1.

In FIG. 12F, using the input={representative part number =EEE} as a key, the following values are acquired from the record set of i=0~21.

{C5 (1)=0 (factory number), C5 (2)=EX005 (model number)}

{C10 (1)=1 (factory number), C10 (2)=ADD005 (model number)}

{C14 (1)=2 (factory number), C14 (2)=EX005 (model number)}

{C17 (1)=3 (factory number), C17 (2)=EX005 (model number)}

{C20 (1)=4 (factory number), C20 (2)=BIG005 (model number)}

In the system shown in FIG. 3, the data relating to sales can be stored as an XML-6 file in the storage device of the HUB system 12 from the sales division over a network.

In FIG. 15, the computer system comprises a central processing unit (CPU) 40, read only memory (ROM) 41, random access memory (RAM) 42, a communication interface 43, a storage device 44, an input/output device 45, a reading device 46 of a portable storage medium, and a bus 47 to which all these component are connected.

The storage device 44 can be various types of storage devices such as a hard disk, a magnetic disk, etc. These storage devices 44 or the ROM 41 store a program shown in the flowchart in FIG. 5, a program of the present invention. By the programs executed by the CPU 40, the design data including the design change data made at a factory side according to the present embodiment can be centrally managed, and a change history can be correctly traced.

The above-mentioned program can be stored in the storage device 44 from a program provider 48 through a network 49 and the communication interface 43, stored in a marketed and distributed portable storage medium 50, set in the reading device 46, and executed by the CPU 40. The portable storage medium 50 can be various types of storage media such as CD-ROM, a flexible disk, an optical disk, a magneto optical disk, a DVD, etc. By the reading device 46 reading a program stored in the above-mentioned storage media, the design data can be centrally managed according to the present embodiment.

As explained above in detail, according to the present invention, newly designed data and design change data can be centrally managed, and a design change history can be correctly traced. For example, the data of substitute parts made in a factory can be referenced by other production divisions by accumulating the data as design change data. As a result, information conventionally lost in a division other than the factory that uses substitute parts can be retrieved. This is a new operation and very significant in various applications. Furthermore, a part as a cause of a problem is estimated when there is a fault with a product, and it can be determined whether or not there is a problem with the supplier who provides the part.

What is claimed is:

1. A computer-readable portable storage medium storing a design data management program to direct a computer to manage design data generated at a designing side of a product to be produced at a production side based on the design data, the program comprising:
   a step of converting the design data generated at the designing side in a first format to design data in a second format that is applicable to the production side;
   a step of transmitting the design data in the second format to the production side;
   a step of converting the design data in the first format to design data in a third format that is described in a predetermined language;
   a step of storing the design data in the third format in a storage device;
   a step of receiving from the production side design change data in a fourth format that indicates a change made to the design data in the second format in producing the product, the product being produced with the design change data without approval from the designing side;
   a step of converting the design change data in the fourth format to design change data in the third format;
   a step of storing the design change data in the third format in the storage device; and
   a step of converting information about a purchase of a part used in the product on the production side into purchase data described in the predetermined language and storing the purchase data in the storage device upon receipt of the information about the purchase of the part.

2. The storage medium according to claim 1, wherein the design data management program further comprises:
   a first procedure of identifying a first part of the product that has caused the design change on the production side with a frequency higher than a frequency of another part of the product or higher than a threshold frequency; and
   a second procedure of identifying a first supplier of the first part.

3. The storage medium according to claim 2, wherein the first procedure comprises:
   a procedure of specifying first information for designation of a factory on the production side, second information for designation of a design change originating division, and third information for designation of a reason for a design change for design change history information stored in the storage device, and acquiring fourth information for identification of the first part.

4. The storage medium according to claim 2, wherein the second procedure comprises:
   a procedure of acquiring a first model number by specifying first information for designation of a factory and fourth information for designation of the first part from a manufacturing bill of materials; and
   a procedure of specifying information for designation of the first model number to a purchase division database and acquiring fifth information for identification of the first supplier that provides the first part with the first model number.

5. The storage medium according to claim 1, wherein the design data management program further comprises:
   a third procedure of detecting a design change frequency on the production side of a second part provided from a first supplier of a first part of the product that has caused a design change on the production side with a frequency higher than a frequency of another part of the product or higher than a threshold frequency;
   a fourth procedure of detecting a design change frequency on the production side of the second part provided from a second supplier; and
   a fifth procedure of comparing design change frequencies of the second part between the first supplier and the second supplier.

6. The storage medium according to claim 5, wherein the third procedure comprises:
   a sixth procedure of specifying fifth information for designation of the first supplier to a purchase division database, and acquiring a second model number of the second part provided from the first supplier;
   a seventh procedure of specifying the second model number to a manufacturing bill of materials, and acquiring sixth information for identification of the second part;
   an eighth procedure of specifying the sixth information in the manufacturing bill of materials, and acquiring respective model numbers for each factory corresponding to the second part; and
   a ninth procedure of acquiring a design change frequency for the second model number by specifying one or more factories dealing with the second part with the second model number to design change history information; and
   the fourth procedure comprises:
   a tenth procedure of acquiring the design change frequency for each of model numbers acquired in the eighth procedure other than the second model number, wherein acquisition of the design change frequency for one model number is performed by specifying the sixth information designating the second part and eighth information designating one or more factories dealing with the second part with the one model number to the design change history information.

7. The storage medium according to claim 2, wherein the design change frequency is identified by specifying information designating a factory, a part, a design change originating division and a reason for a design change for design change history information stored in the storage device.

8. The storage medium according to claim 1, wherein the design data management program further comprises a procedure of transmitting and receiving information over a network among a system of the designing side, a system of the production side, a system of a purchase side, and a hub system in which the storage device is provided.

9. The storage medium according to claim 1, wherein design change history information, a manufacturing bill of materials, or a purchase database are described in an extensible markup language, and the design data management program directs the computer to perform display on a viewer in a table form.

10. The storage medium according to claim 1, wherein the design data management program further comprises a procedure of converting information about sales of the product produced on the production side into sales data described in the predetermined language and storing the sales data in the storage device upon receipt of the information about sales of the product.

* * * * *

UNITED STATES PATENT AND TRADEMARK OFFICE
CERTIFICATE OF CORRECTION

PATENT NO. : 7,337,029 B2
APPLICATION NO. : 11/505596
DATED : February 26, 2008
INVENTOR(S) : Osamu Oyamada et al.

It is certified that error appears in the above-identified patent and that said Letters Patent is hereby corrected as shown below:

ON THE TITLE PAGE:

Item "[75] Inventors:"

Delete "Yoshitaka Miki, Osaka (KP)" and insert --Yoshitaka Miki, Osaka (JP)--.

Signed and Sealed this

Seventeenth Day of June, 2008

JON W. DUDAS
*Director of the United States Patent and Trademark Office*